(12) United States Patent
Chaji et al.

(10) Patent No.: US 12,463,162 B2
(45) Date of Patent: Nov. 4, 2025

(54) MICRODEVICE CARTRIDGE STRUCTURE

(71) Applicant: VueReal Inc., Waterloo (CA)

(72) Inventors: Gholamreza Chaji, Waterloo (CA); Ehsanollah Fathi, Waterloo (CA)

(73) Assignee: VueReal Inc., Waterloo (CA)

( * ) Notice: Subject to any disclaimer, the term of this patent is extended or adjusted under 35 U.S.C. 154(b) by 932 days.

(21) Appl. No.: 17/293,441

(22) PCT Filed: Nov. 18, 2019

(86) PCT No.: PCT/IB2019/059903
§ 371 (c)(1),
(2) Date: May 12, 2021

(87) PCT Pub. No.: WO2020/100127
PCT Pub. Date: May 22, 2020

(65) Prior Publication Data
US 2022/0005774 A1      Jan. 6, 2022

Related U.S. Application Data

(60) Provisional application No. 62/934,286, filed on Nov. 12, 2019, provisional application No. 62/926,980, (Continued)

(51) Int. Cl.
*H01L 23/00* (2006.01)
*H10H 20/851* (2025.01)
(Continued)

(52) U.S. Cl.
CPC ........... *H01L 24/05* (2013.01); *H10H 20/851* (2025.01); *H10H 20/856* (2025.01); *H10H 20/857* (2025.01); *H01L 2224/05027* (2013.01)

(58) Field of Classification Search
CPC . H01L 21/76898; H01L 23/28; H01L 23/535; H01L 24/05; H01L 25/0753;
(Continued)

(56) References Cited

U.S. PATENT DOCUMENTS

| | | |
|---|---|---|
| 5,501,990 A | 3/1996 | Holm |
| 7,482,667 B2 | 1/2009 | Guidotti |

(Continued)

FOREIGN PATENT DOCUMENTS

| | | |
|---|---|---|
| JP | 2014116392 A | 6/2014 |
| KR | 20170121777 A | 11/2017 |
| KR | 20170133746 A | 12/2017 |
| TW | 201813130 A1 | 4/2018 |

OTHER PUBLICATIONS

International Search Report and Written Opinion in International Application No. PCT/IB2019/059903, mailed Feb. 24, 2020 (19 pages).

*Primary Examiner* — Fazli Erdem
(74) *Attorney, Agent, or Firm* — Nixon Peabody LLP

(57) ABSTRACT

What is disclosed is structures and methods of integrating micro devices into system substrate. Further, the disclosure, also relates to methods and structures for enhancing the bonding process of micro-devices into a substrate. More specifically, it relates to expanding the micro device area or bonding area of micro devices.

20 Claims, 19 Drawing Sheets

Related U.S. Application Data filed on Oct. 28, 2019, provisional application No. 62/768,812, filed on Nov. 16, 2018.

(51) Int. Cl.
  *H10H 20/856* (2025.01)
  *H10H 20/857* (2025.01)

(58) Field of Classification Search
  CPC . H01L 31/0203; H01L 31/0224; H01L 33/50; H01L 33/60; H01L 33/62; H01L 33/0093; H01L 33/44; H01L 33/382; H01L 33/483; H01L 2224/05027; H10F 77/20; H10F 77/50; H10H 20/018; H10H 20/8312; H10H 20/84; H10H 20/8506
  USPC .......................................................... 257/98
  See application file for complete search history.

(56) References Cited

U.S. PATENT DOCUMENTS

| | | |
|---|---|---|
| 9,111,949 B2 | 8/2015 | Yu |
| 2005/0230700 A1 | 10/2005 | Stefanov et al. |
| 2007/0284752 A1 | 12/2007 | Lin |
| 2012/0074441 A1 | 3/2012 | Seo et al. |
| 2014/0158415 A1* | 6/2014 | Golda ................ H01L 21/6835 |
| | | 174/262 |
| 2014/0264909 A1* | 9/2014 | Liu ........................ B81B 7/007 |
| | | 257/774 |
| 2015/0380459 A1* | 12/2015 | Bono ...................... H01L 31/18 |
| | | 257/14 |
| 2017/0345801 A1 | 11/2017 | Lin et al. |
| 2018/0145225 A1 | 5/2018 | Perzlmaier |
| 2018/0315738 A1* | 11/2018 | Bono ................. H01L 25/0753 |
| 2019/0341306 A1* | 11/2019 | Yu ........................... H01L 24/08 |
| 2020/0075809 A1* | 3/2020 | Rajan ..................... H01L 33/16 |
| 2020/0083106 A1* | 3/2020 | Cheng ............ H01L 21/823418 |

* cited by examiner

MICRODEVICE CARTRIDGE STRUCTURE

CROSS-REFERENCE TO RELATED APPLICATIONS

This application is a U.S. National Stage entry of International Application No. PCT/IB2019/059903, filed on Nov. 18, 2019, which claims priority to U.S. Provisional Patent Application Ser. No. 62/934,286, filed on Nov. 12, 2019, U.S. Provisional Patent Application Ser. No. 62/926,980, filed on Oct. 28, 2019, and U.S. Provisional Patent Application Ser. No. 62/768,812 filed Nov. 16, 2018, each of which is hereby incorporated by reference herein in its entirety.

FIELD OF THE INVENTION

The present disclosure relates to the integration of micro devices into system substrate. Further, the disclosure also relates to methods and structures for enhancing the bonding process of micro-devices into a substrate. More specifically, the present disclosure relates to expanding an area of micro devices or a bonding area of micro devices.

BACKGROUND OF THE INVENTION

Development of micro-devices consists of a few major steps such as epitaxial growth of multiple layers, patterning and passivation of the layers, and lift off process. These steps can be costly and therefore, there is a significant desire to reduce the size of micro-devices to produce more of them in one wafer substrate. This way, the cost per micro-device can be reduced.

However, handling and bonding of such a device can be challenging. For example, for a sub 10 micrometer device, the pads can be as small as a couple of micrometers. Bonding such small pads to a substrate requires significant alignment as the quality of the bonding will be affected significantly by the overlap. Moreover, the property of such bonding can be compromised due to the small surface area of the bond pads. There remains a need for expanding the device area or bonding area of micro devices.

BRIEF SUMMARY

According to one embodiment, there may be provided a method of integrating micro devices on a backplane comprising; providing a micro device substrate comprising one or more micro devices; bonding a selective set of the micro devices from the substrate to the backplane by connecting pads on the micro devices and corresponding pads on the backplane, leaving the bonded selective set of micro devices on the backplane by separating the micro device substrate.

According to another embodiment, the pads on a flip chip device are formed or transferred on the proper side of the device that can be bonded to the backplane.

According to one embodiment of the present disclosure, an optoelectronic device may be provided. The optoelectronic device may comprising: a plurality of semiconductor layers disposed on a substrate forming a top surface and a bottom surface, wherein the plurality of semiconductor layers having isolated areas forming at least one side surface; at least one conductive pad coupled to the optoelectronic device on at least one of the top or the bottom surface; and one or more extension layers formed around the optoelectronic device at the at least one side surface, wherein the at least the one conductive pad is extended to the one or more extension layers.

BRIEF DESCRIPTION OF THE DRAWINGS

The foregoing and other advantages of the disclosure will become apparent to those of ordinary skill in the art in view of the detailed description of various embodiments and/or aspects, which is made with reference to the drawings, a brief description of which is provided next.

Figure 1A:
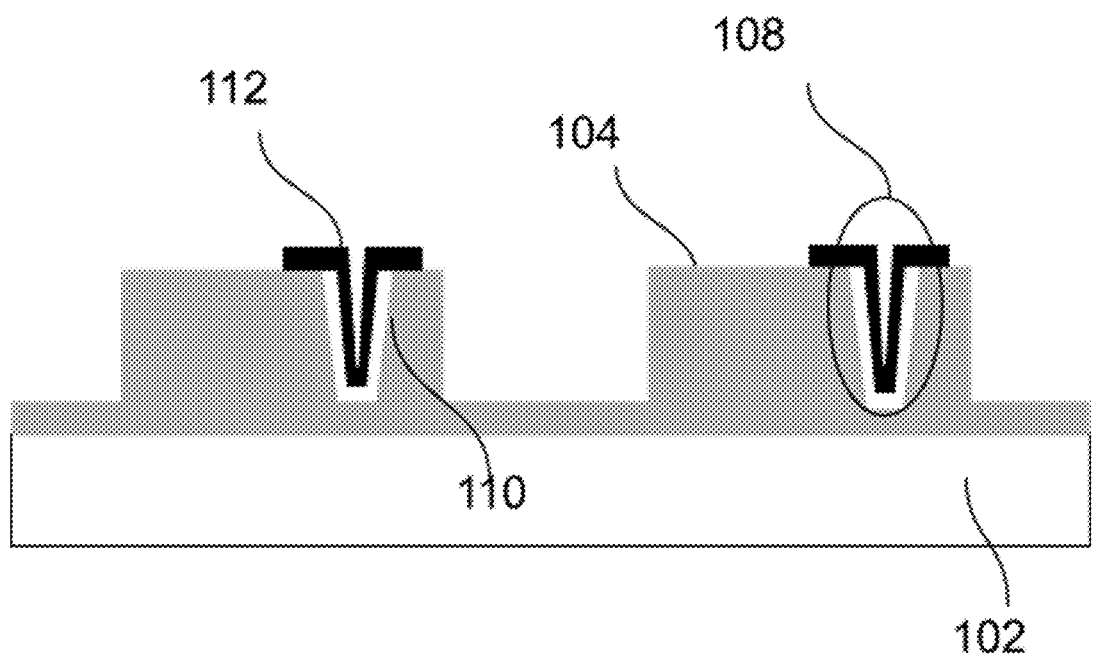
FIG. 1A shows a cross section view of a micro device mesa with a pass through to VIA to pass the top connection to the other side.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of the invention as defined by the appended claims.

DETAILED DESCRIPTION

In this description, the term "device", "optoelectronic device" and "micro device" are used interchangeably. However, it is clear to one skilled in the art that the embodiments described here are independent of the device size. As used in the specification and claims, the singular forms "a", "an" and "the" include plural references unless the context clearly dictates otherwise. Various embodiments in accordance with the present structures and processes provided are described below in detail.

A few embodiments of this description are related to integration micro-devices into a receiving substrate. The system substrate may comprise micro light emitting diodes (LEDs), Organic LEDs, sensors, solid state devices, integrated circuits, (micro-electro-mechanical systems) MEMS, and/or other electronic components.

Further, a few embodiments relate to methods and structures for enhancing the bonding process of micro-devices into a substrate (e.g. system substrate). More specifically, the present disclosure relates to expanding the device area or bonding area of micro devices. Herein described, an optoelectronic device comprising one or more extension layers formed around the optoelectronic device and at least one contact layer extended to the extension layers.

The receiving substrate may be, but is not limited to, a printed circuit board (PCB), thin film transistor backplane, integrated circuit substrate, or, in one case of optical micro devices such as LEDs, a component of a display, for example a driving circuitry backplane. The patterning of micro device donor substrate and receiving substrate can be used in combination with different transfer technology including but not limited to pick and place with different mechanisms (e.g. electrostatic transfer head, elastomer transfer head), or direct transfer mechanism such as dual function pads and more.

In one embodiment, microdevice structure that comprises of a top and bottom doped layer, active or functional layers between the top and bottom layers, a VIA from the top doped layer to the bottom doped layer where the VIA is passivated with a dielectric and filled partially or fully by a conductive material and the VIA is coupled to the top doped layer through extension of a conductive layer on top of the VIA.

In another embodiment, a microdevice structure comprises of a top and bottom doped layer, active or functional layers between the top and bottom layers, a VIA from the top doped layer to the bottom doped layer where the VIA is passivated with a dielectric and a filled partially or fully by a conductive material the VIA is separated from the top doped layers by a dielectric layer.

Various embodiments in accordance with the present structures and processes provided are described below in detail.

With reference to FIG. 1A, a micro device substrate 102 is provided. An array of micro devices 104 may be developed on the micro device substrate 102. In one case, the micro-devices can be micro light emitting devices. In another case, the micro devices may be any micro device that may typically be manufactured in planar batches, including but not limited to LEDs, OLEDs, sensors, solid state devices, integrated circuits, MEMS, and/or other electronic components.

In one case, one or more planar active layers may be formed on a substrate 102. The planar active layers may comprise a first bottom conductive layer, functional layers, e.g. light-emitting, and a second top conductive layer. The micro devices may be developed by etching of the planar active layers. In one case, the etching may be done all the way to the micro device substrate. In another case, the etching may be done partially on the planar layers and leaving some on a surface of the micro device substrate. Other layers may be deposited and patterned before forming or after forming the micro devices.

In this embodiment, a VIA 108 is formed to pass the top contact to the bottom side. Here, a dielectric 110 is deposited to cover the sidewall. The dielectric 110 can cover the bottom of the VIA 108. The dielectric 110 can cover part of the top layer or the sidewall of the microdevice. The VIA can be filled fully or partially with conductive layer 112. The conductive layer 112 is at least partially connected to the top layer of the micro device 104.

Figure 1B:
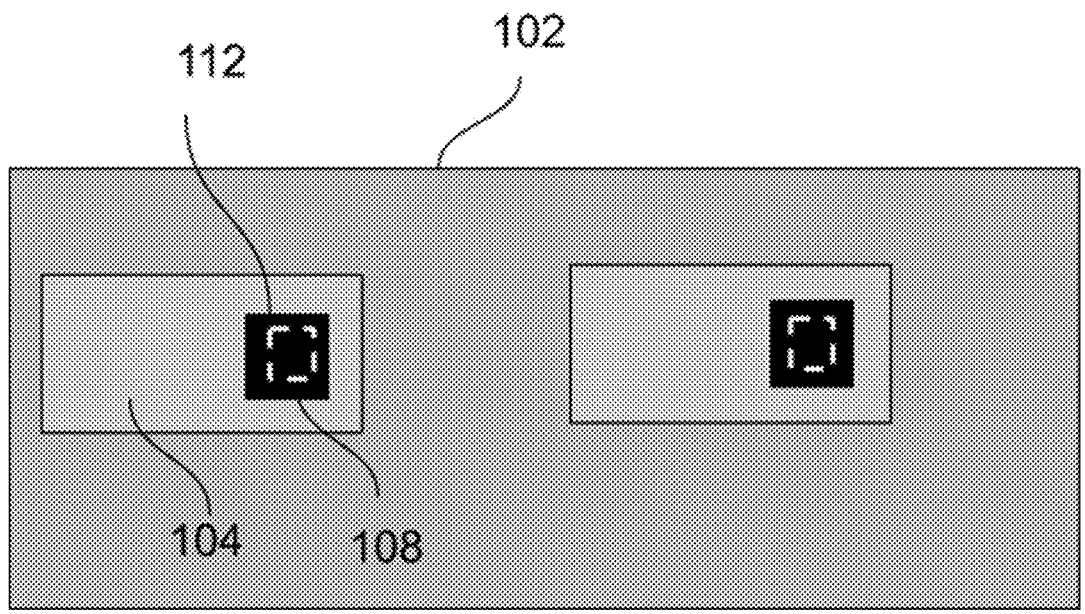
FIG. 1B shows the top view of the device with a pass through a VIA.

With reference to FIG. 1B, the conductive layer 112 extends outside the VIA 108 on the top of the micro device 104. Part of the extended area of the conductive layer 112 can be connected to the top layer of the micro device 104.

Figure 1C:
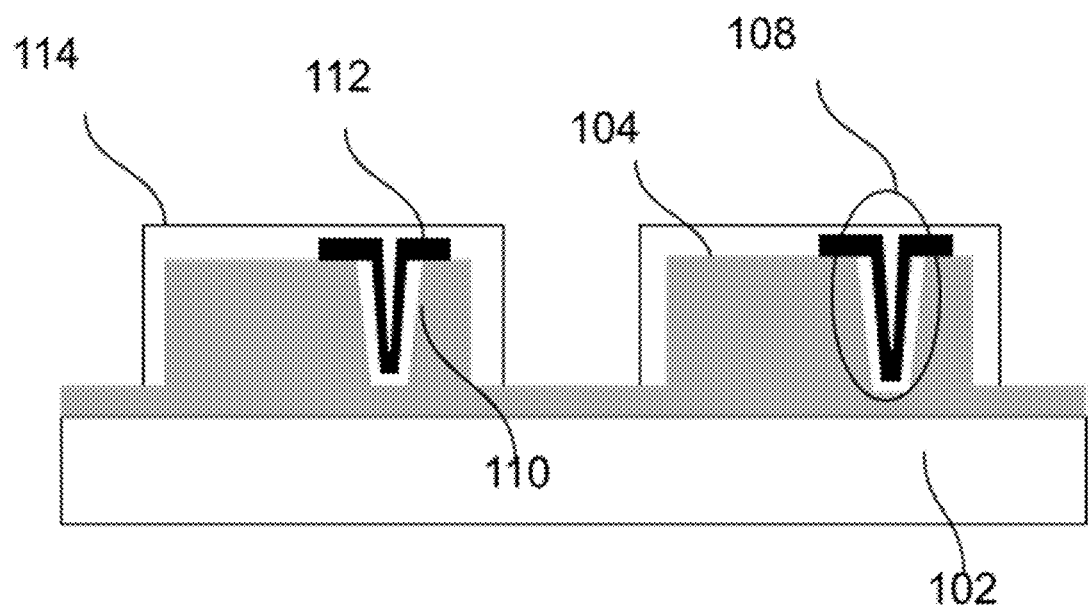
FIG. 1C shows a cross section view of a micro device covered with sacrificial layer(s).
Figure 1D:
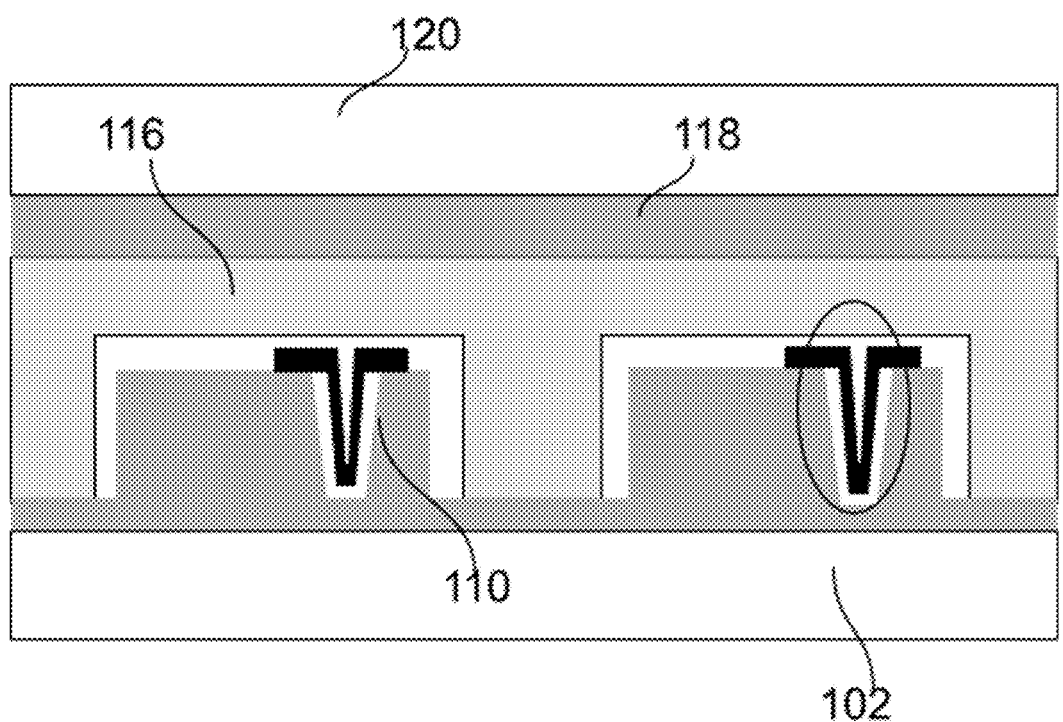
FIG. 1D shows a cross section view of the micro device bonded to an intermediate substrate, according to one embodiment of the present invention.

As demonstrated in FIG. 1C, a sacrificial layer 114 (or layers) is formed to at least cover the exposed area of the microdevice 104 surfaces. The sacrificial layer 114 can be patterned to have an opening to the device 104 for forming an anchor. In one case, the area on top of the VIA 108 may have an opening in the sacrificial layers 114. In FIG. 1D, a planarization layer 116 is formed on the micro device substrate 102 to surround the microdevices 104. In case there is an opening in the sacrificial layer(s) 114, the opening will get filled with the planarization layer forming an anchor. As demonstrated in FIG. 1D, a bonding layer 118 is used to bond the new structure into a secondary substrate 120. Here, the bonding 118 and planarization layer 116 can be the same. In another case, the planarization layer 116 is developed and cured before bonding with the bonding layer 118.

Figure 1E:
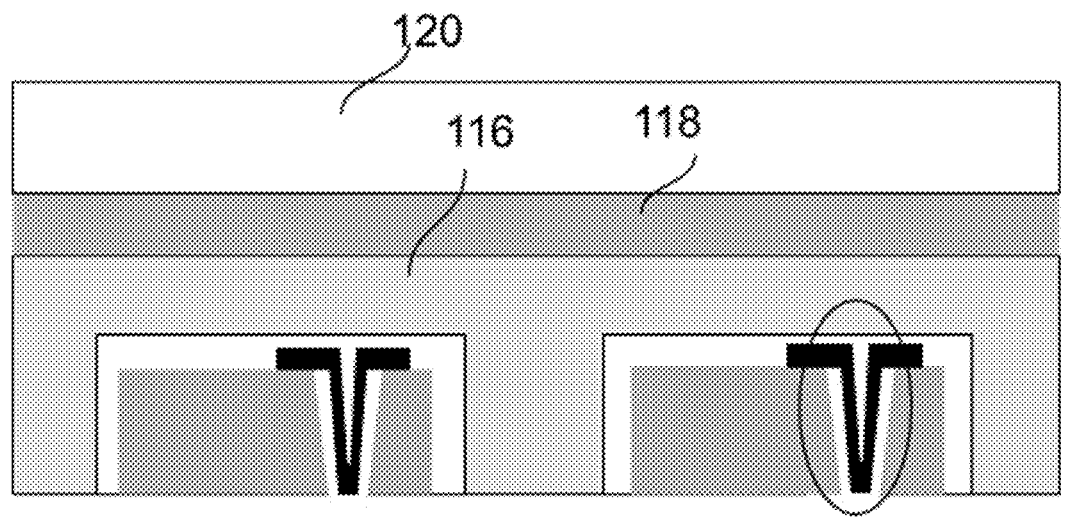
FIG. 1E shows a cross section view of the micro device separated from the first substrate.

With reference to FIG. 1E, the first substrate 102 is separated from the micro device 104. Leaving the structure bonded to the second substrate. An etch back or removal of the extra layer can expose the surface of the planarization layer 116 (or sacrificial layer 114). At this point the conductive layer 112 can be exposed from the bottom side, or further etching may be needed to do so.

Figure 1F:
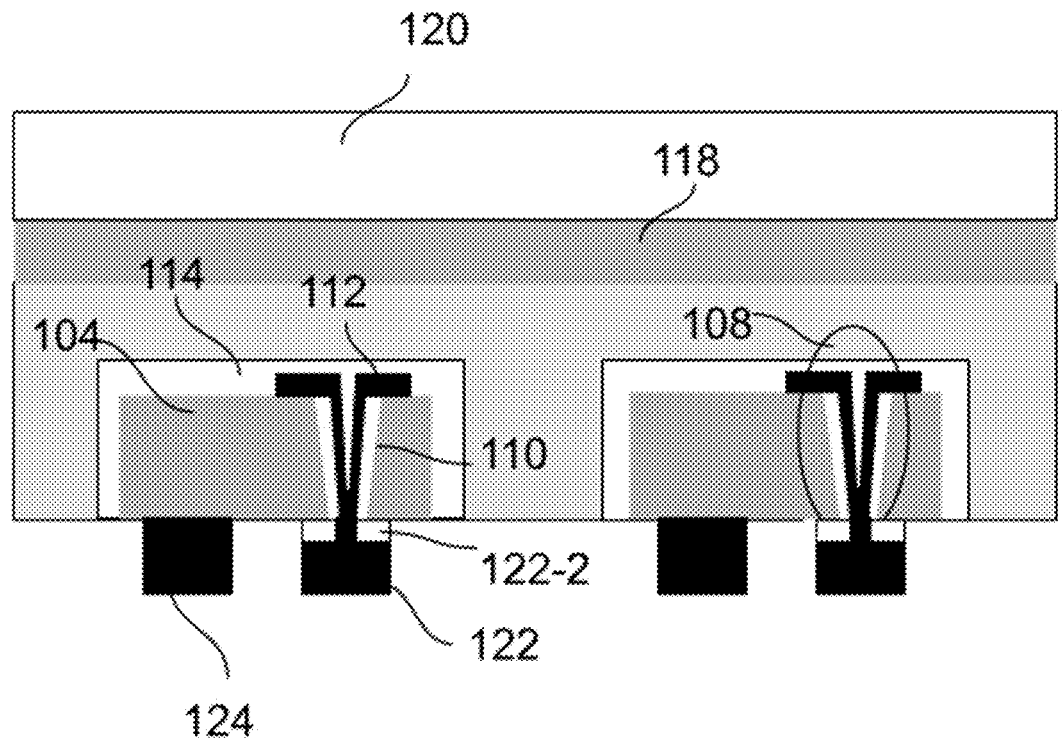
FIG. 1F shows a cross section view of the micro device with at least one pad formed on top of the pass through VIA.

As demonstrated in FIG. 1F, bumps 122, 124 (or pads) can be formed on the micro-device coupled directly to the bottom surface and the top surface through the VIA 108 and conductive layer 112. The bottom and top surface may have a doped layer or ohmic contact layer. A dielectric layer 122-2 is separating the bump 122 from the bottom surface.

Reference to FIG. 1A to 1E, there is a microdevice that has top and bottom doped layers. There can be an ohmic layer partially or fully covering the top or bottom layers. Between the doped layers are active or functional layers such as multi quantum wells, barrier, blocking, cladding and etc. There is VIA 108 going all the way from the top doped layer and the bottom doped layer. It can also go through the ohmic layer or other conductive layers on top or bottom. The VIA 108 is passivated with a dielectric 110 and fully or partially covered by conductive 112 material. The conductive 112 materials are partially or fully coupled to the top ohmic or doped layer. A pad or bump 122 is formed coupled with the conductive material 112 in the VIA 108 while separated from the bottom ohmic or doped layer by a dielectric 122-2. Another bump/pad 124 is formed to couple with the bottom ohmic/doped layer. The dielectric layers can be the same layers. The dielectric can cover the full top and bottom surface and have an opening to provide access to the top or bottom layers if needed.

Figure 2A:
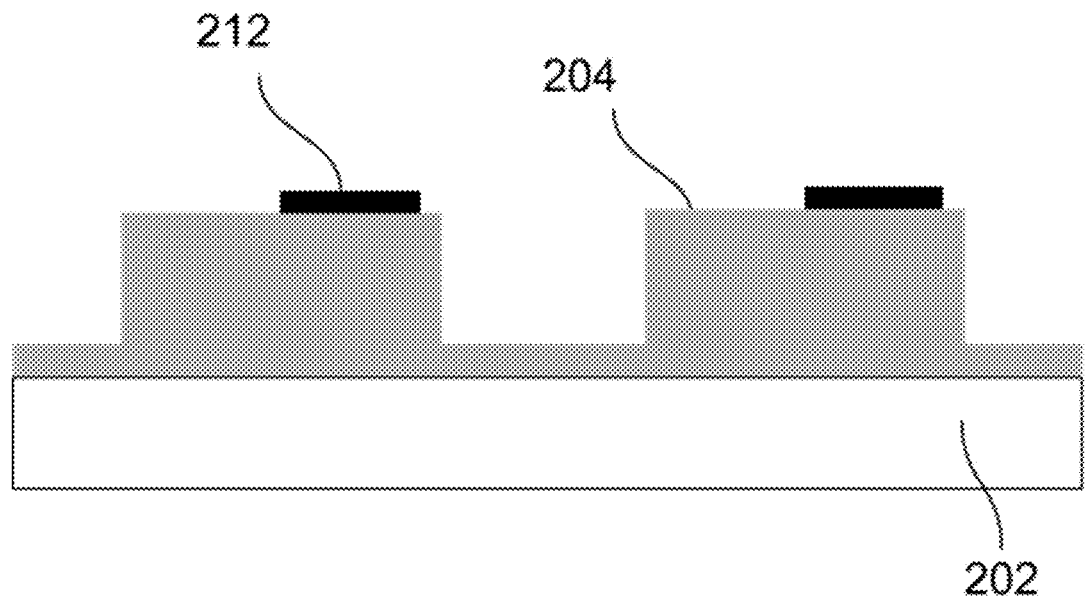
FIG. 2A shows a cross section view of a micro device mesa with protection layer at the top.

With reference to FIG. 2A, a micro device substrate 202 is provided. An array of micro devices 204 may be developed on the micro device substrate 202. In one case, the micro-devices can be micro light emitting devices. In another case, the micro devices 204 may be any micro device that may typically be manufactured in planar batches, including but not limited to LEDs, OLEDs, sensors, solid state devices, integrated circuits, MEMS, and/or other electronic components.

In one case, one or more planar active layers may be formed on a substrate 202. The planar active layers may comprise a first bottom conductive layer, doped layer, functional layers, e.g. light-emitting, another top doped layer and a second top conductive layer. The micro devices may be developed by etching of the planar active layers. In one case, the etching may be done all the way to the micro device substrate. In another case, the etching may be done partially on the planar layers and leaving some on a surface of the micro device substrate. Other layers may be deposited and patterned before forming or after forming the micro devices.

A protective layer 212 can be formed on top of the micro device 204. This protective layer can be conductive and coupled to the top doped or ohmic layer. The protective layer can be part of the ohmic layer.

Figure 2B:
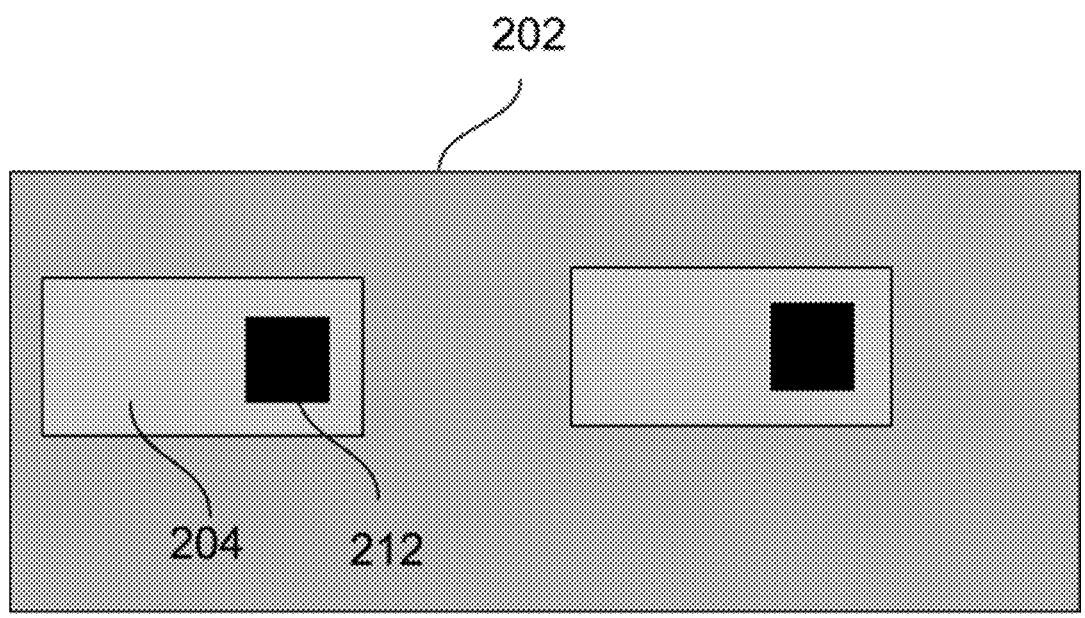
FIG. 2B shows the top view of the device with a protection layer.

With reference to FIG. 2B, the conductive layer 212 is on the top of the micro device 204. Part of the conductive layer 212 can be connected to the top layer of the micro device 204.

Figure 2C:
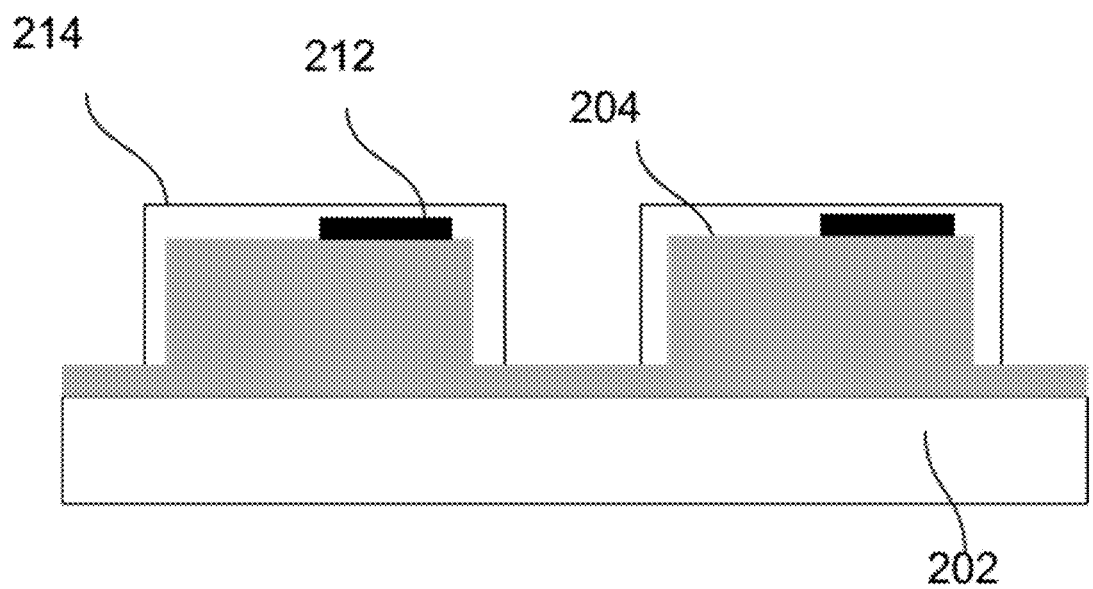
FIG. 2C shows a cross section view of the micro device covered with sacrificial layer(s).
Figure 2D:
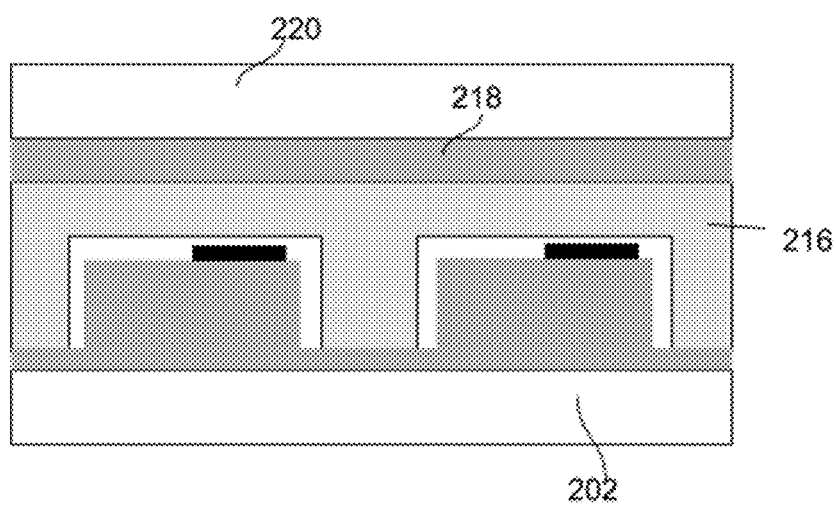
FIG. 2D shows a cross section view of the micro device bonded to an intermediate substrate, according to one embodiment of the present invention.

As demonstrated in FIG. 2C, a sacrificial layer 214 (or layers) is formed to at least cover the exposed area of the microdevice 204 surfaces. The sacrificial layer 214 can be patterned to have an opening to the device 204 for forming an anchor. In one case, the area on top of the protective 212 may have an opening in the sacrificial layers 214. In FIG. 2D, a planarization layer 216 is formed on the micro device substrate 202 to surround the microdevices 204. In case there is an opening in the sacrificial layer(s) 214, the opening will get filled with the planarization layer 216, forming an anchor. As demonstrated in FIG. 2D, a bonding layer 218 is used to bond the new structure into a secondary substrate 220. Here, the bonding 218 and planarization layer 216 can be the same. In another case, the planarization layer 216 is developed and cured before bonding with the bonding layer 218.

Figure 2E:
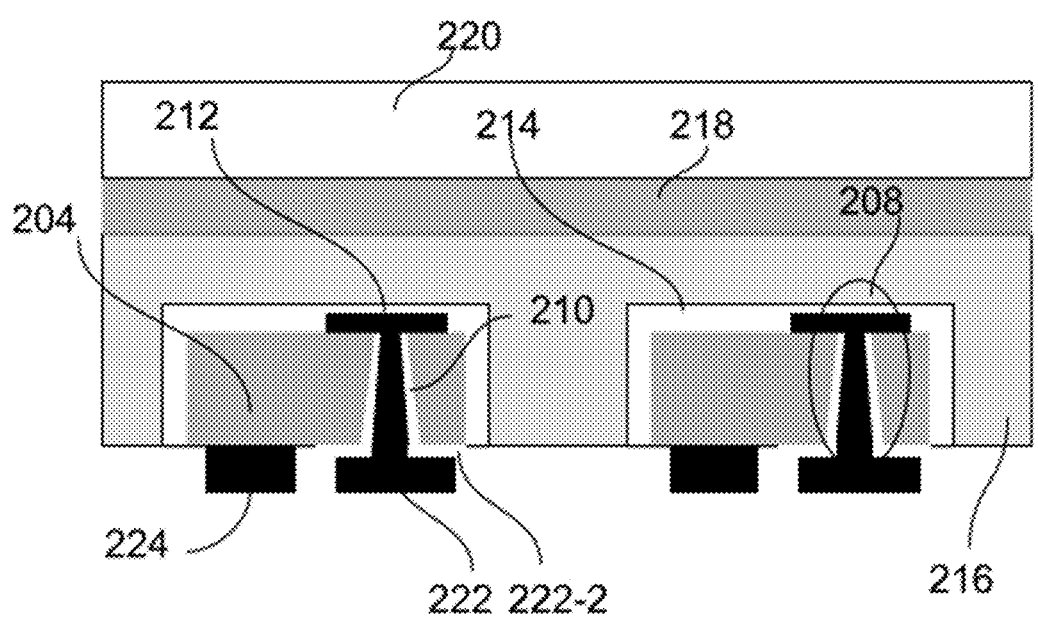
FIG. 2E shows a cross section view of the micro device separated from the first substrate.

With reference to FIG. 2E, the first substrate 202 is separated from the micro device 204. Leaving the structure bonded to the second substrate. An etch back or removal of the extra layer can expose the surface of the planarization layer 216 (or sacrificial layer 214). At this point the conductive layer 212 can be exposed from the bottom side, or further etching may be needed to do so.

In this embodiment, a VIA 208 is formed to pass the top contact to the bottom side. Here, a dielectric 210 is deposited to cover the sidewall. The VIA 208 is extended from the bottom to the protective layer (or to the top conductive layer) and it can be filled fully or partially with conductive layer 212. A pad 222 can be formed that is connected to the conductive layer 212. The pad 222 is separated from the bottom layer with a dielectric 222-2. The dielectric layer 222-2 can be the same as 210. Another pad 224 is formed that is connected to the bottom layer. These pads 222, 224 can be used to connect the device to a backplane.

Reference to FIG. 2A to 2E, there is a microdevice 204 that has a top and bottom doped layer. There can be an ohmic layer partially or fully covering the top or bottom layers. Between the doped layers are active or functional layers such as multi quantum wells, barrier, blocking, cladding and etc. There is VIA 208 going all the way from the top doped layer and the bottom doped layer. It can also go through the ohmic layer or other conductive layers on top or bottom. The VIA 208 is passivated with a dielectric 210. A conductive layer 212 is at one end of the VIA 208 formed on top of the microdevice 204. The conductive 212 materials are partially or fully coupled to the top ohmic or doped layer. A pad or bump 222 is formed coupled with the conductive material 212 in the VIA 208 while separated from the bottom ohmic or doped layer by a dielectric 222-2. Another bump/pad 224 is formed to couple with the bottom ohmic/doped layer. The dielectric layers can be the same layers. The dielectric can cover the full top and bottom surface and have an opening to provide access to the top or bottom layers if needed.

Figure 3A:
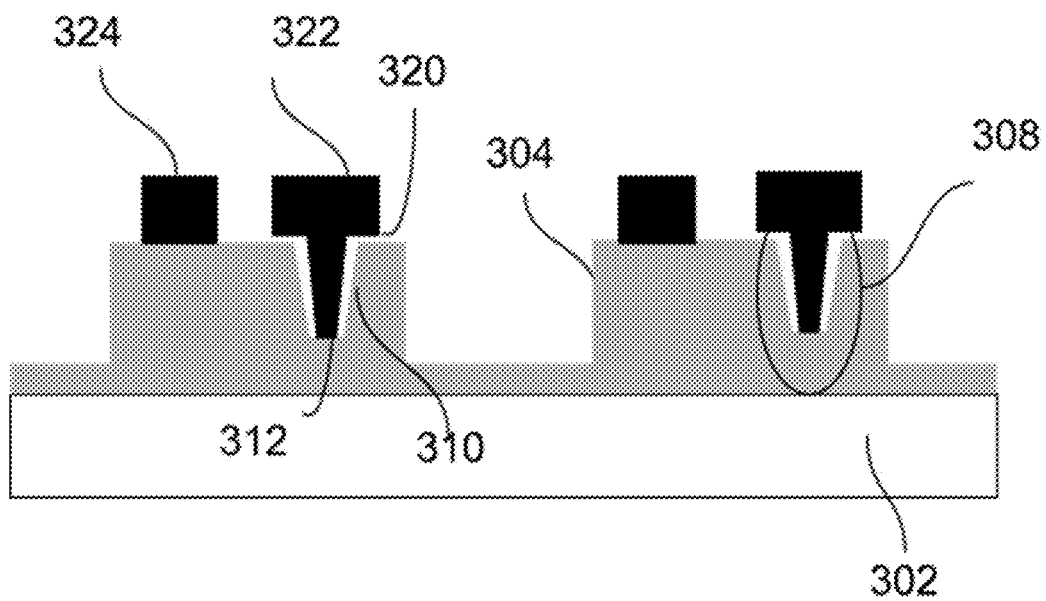
FIG. 3A shows a cross section view of a flip chip micro device mesa with pads on the top side.

With reference to FIG. 3A, a micro device substrate 302 is provided. An array of micro devices 304 may be developed on the micro device substrate 302. In one case, the micro-devices can be micro light emitting devices. In another case, the micro devices 304 may be any micro device that may typically be manufactured in planar batches, including but not limited to LEDs, OLEDs, sensors, solid state devices, integrated circuits, MEMS, and/or other electronic components.

In one case, one or more planar active layers may be formed on a substrate 302. The planar active layers may comprise a first bottom conductive layer, doped layer, functional layers, e.g. light-emitting, another top doped layer and a second top conductive layer. The micro devices may be developed by etching of the planar active layers. In one case, the etching may be done all the way to the micro device substrate. In another case, the etching may be done partially on the planar layers and leaving some on a surface of the micro device substrate. Other layers may be deposited and patterned before forming or after forming the micro devices.

A VIA 308 is formed to provide access to the bottom doped or ohmic layer. The VIA is passivated by a dielectric layer 310. The VIA 308 is fully or partially using conductive layer 312. A bump or pad 322 is formed on the top surface coupled to the conductive layer 312 while the bump 322 is separated from the top side by a dielectric 320 layer. Another bump or pad 324 is formed to connect to the top ohmic or doped layer.

Figure 3B:
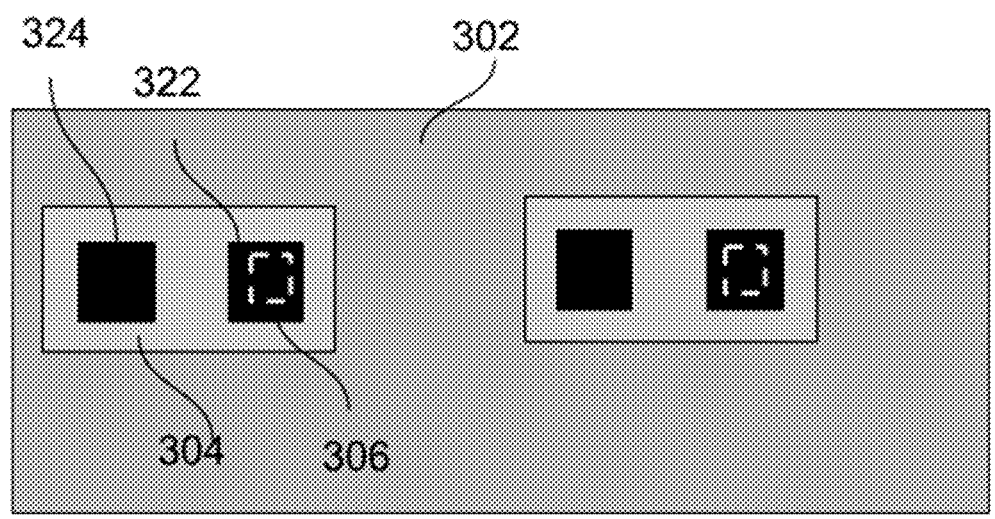
FIG. 3B shows the top view of the device with pads on the top side.

With reference to FIG. 3B, the bumps 322 and 324 are on the top of the micro device 304. Part of the conductive layer 312 can be connected to the top layer of the micro device 306.

Figure 3C:
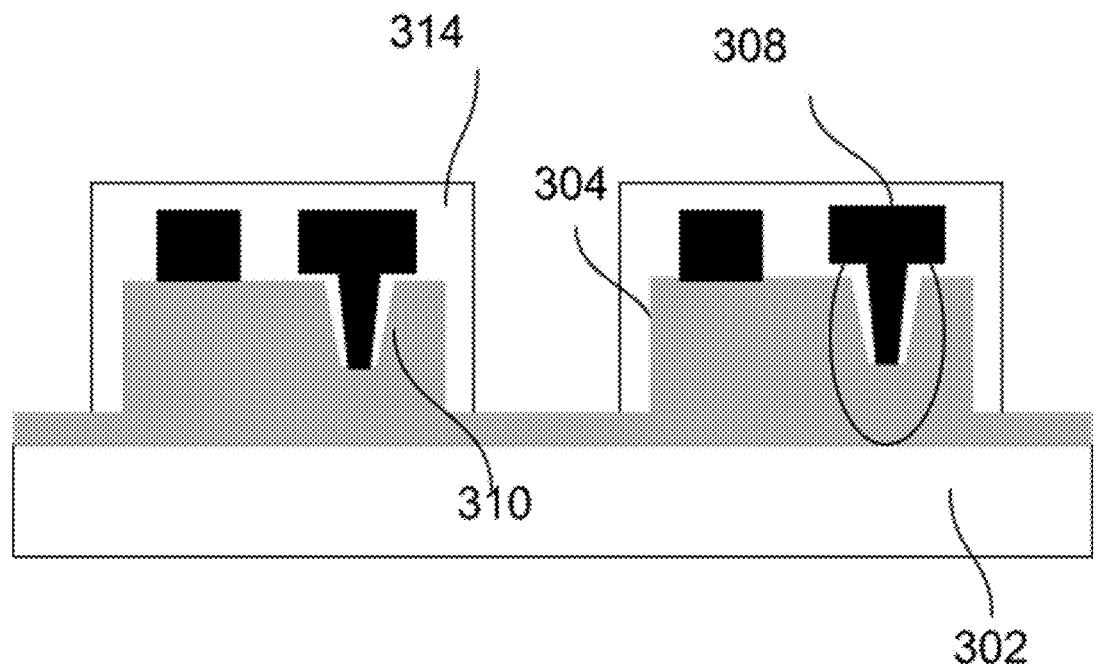
FIG. 3C shows a cross section view of the micro device covered with sacrificial layer(s).
Figure 3D:
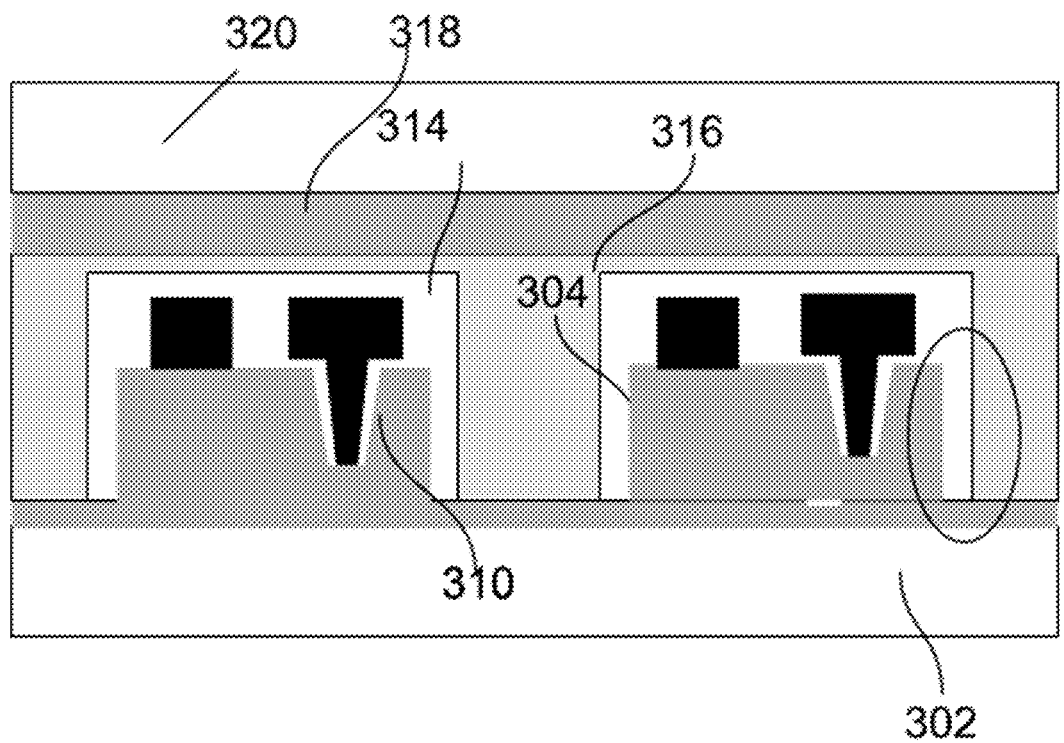
FIG. 3D shows a cross section view of the micro device bonded to an intermediate substrate, according to one embodiment of the present invention.

As demonstrated in FIG. 3C, a sacrificial layer (or layers) 314 is formed to at least cover the exposed area of the microdevice 304 surfaces. The sacrificial layer 314 can be patterned to have an opening to the device 304 for forming an anchor. In one case, the area on top of the protective 312 may have an opening in the sacrificial layers 314. In FIG. 3D, a planarization layer 316 is formed on the micro device substrate 302 to surround the microdevices 304. In case there is an opening in the sacrificial layer(s) 314, the opening will get filled with the planarization layer forming an anchor. As demonstrated in FIG. 3D, a bonding layer 318 is used to bond the new structure into a secondary substrate 320. Here, the bonding 318 and planarization layer 316 can be the same. In another case, the planarization layer 316 is developed and cured before bonding with the bonding layer 318.

Figure 3E:
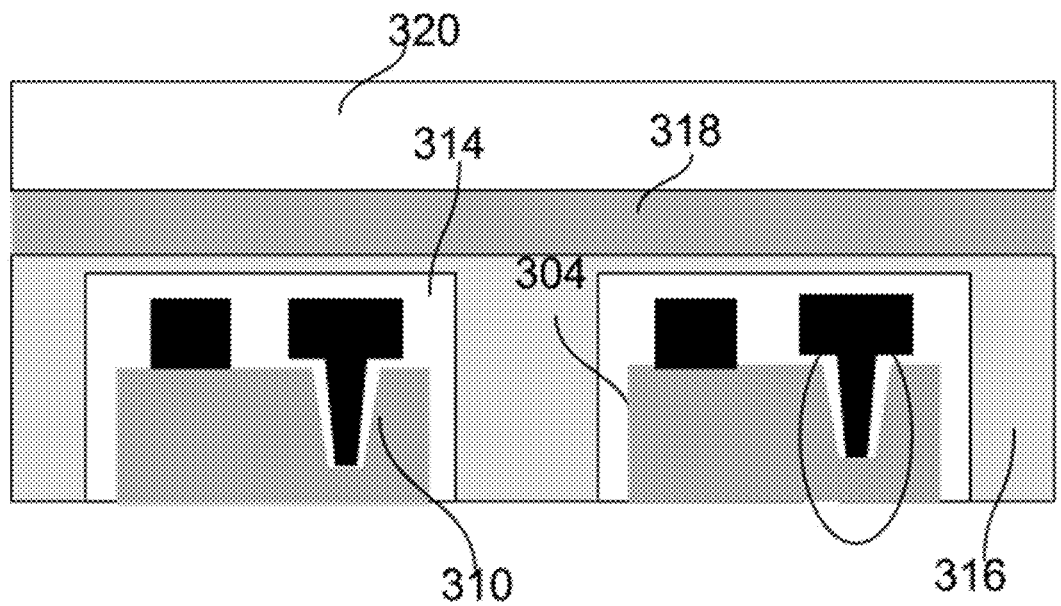
FIG. 3E shows a cross section view of the micro device separated from the first substrate.

With reference to FIG. 3E, the first substrate 302 is separated from the micro device 304. Leaving the structure bonded to the second substrate 320. An etch back or removal of the extra layer can expose the surface of the planarization layer 316 (or sacrificial layer 314).

Figure 3F:
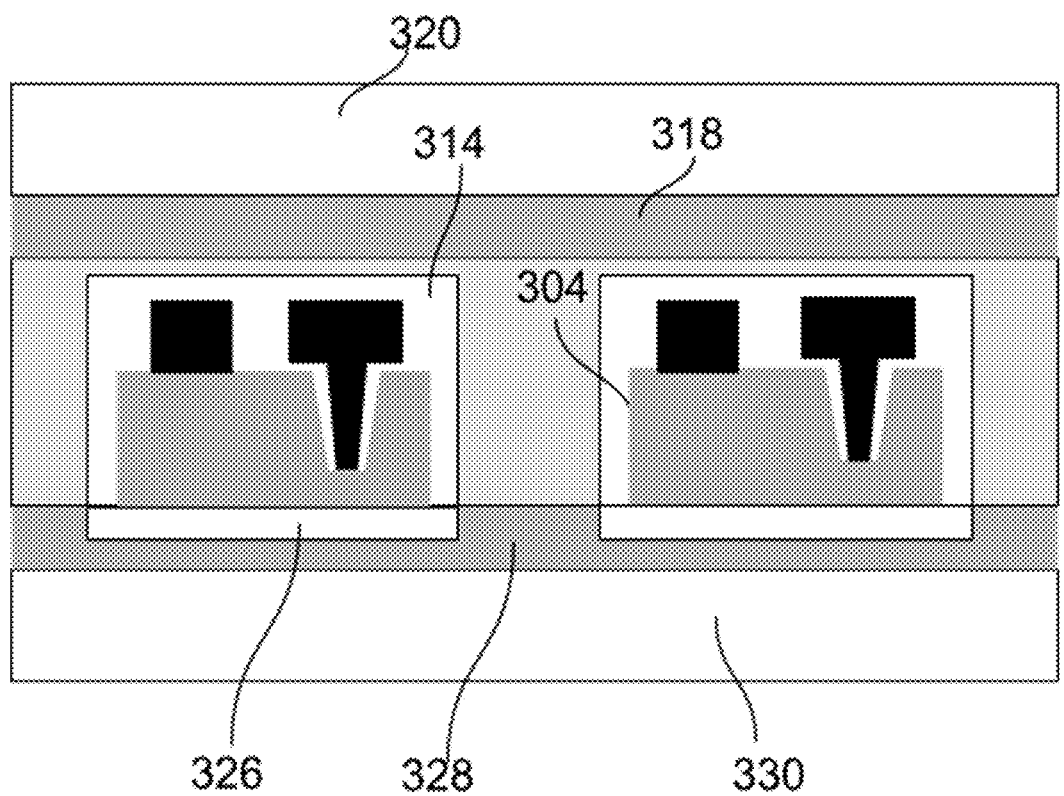
FIG. 3F shows a cross section view of the micro device bonded to a third substrate.
Figure 3G:
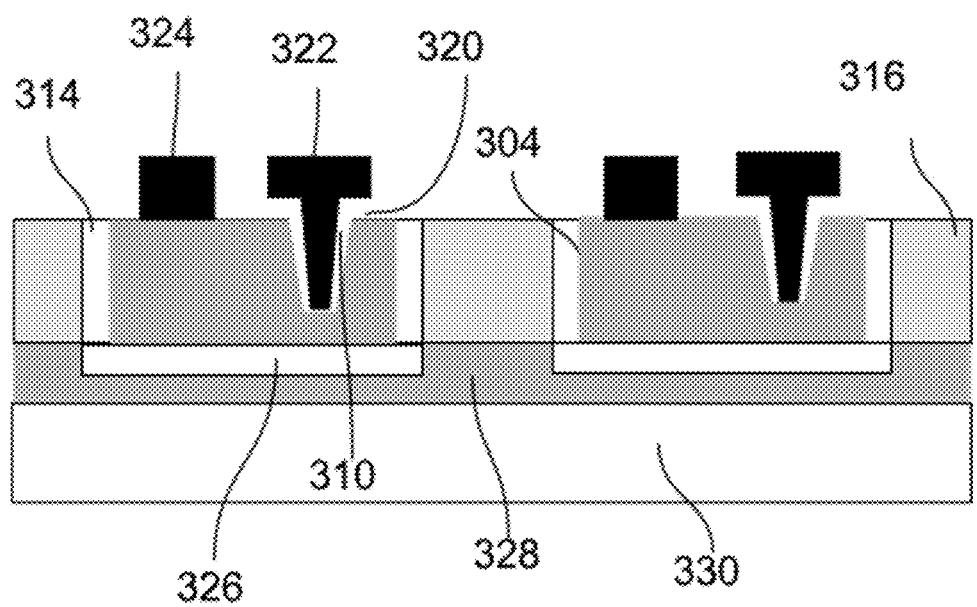
FIG. 3G shows a cross section view of the micro device separated from the second substrate.

As demonstrated in FIG. 3F, a secondary sacrificial layer 326 is formed on the bottom of the microdevice 304. Here, an anchor can be formed by opening a part of the sacrificial layer 326. A new bonding or planarization layer 328 is developed on the surface and bonded to a third substrate 330. As shown in FIG. 3G, the secondary substrate 320 is removed (a release layer may be between the secondary substrate 320 and bonding layer 318). Here, part of sacrificial layer 314 can be partially removed to expose the pads 322 and 324. A new anchor can be formed with metal or dielectric layers connecting the micro device 304 to the planarization 316 (housing structure).

Figure 4A:
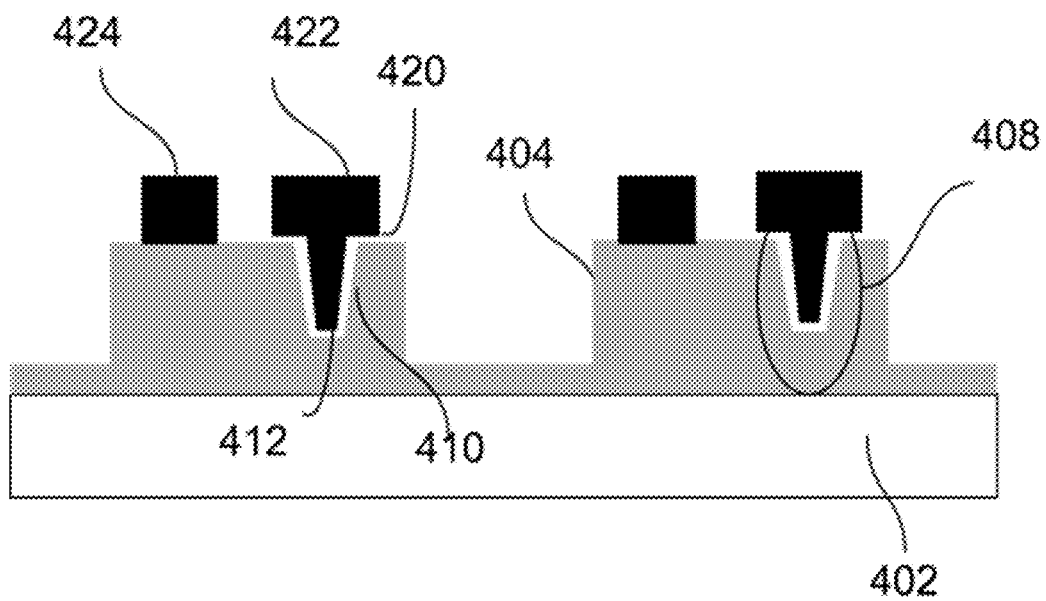
FIG. 4A shows a cross section of the micro device with dielectric covering the top of the micro device.

With reference to FIG. 4A, a micro device substrate 402 is provided. An array of micro devices 404 may be developed on the micro device substrate 402. In one case, the micro-devices can be micro light emitting devices. In another case, the micro devices 404 may be any micro device that may typically be manufactured in planar batches, including but not limited to LEDs, OLEDs, sensors, solid state devices, integrated circuits, MEMS, and/or other electronic components.

In one case, one or more planar active layers may be formed on a substrate 402. The planar active layers may comprise a first bottom conductive layer, doped layer, functional layers, e.g. light-emitting, another top doped layer and a second top conductive layer. The micro devices may be developed by etching of the planar active layers. In one case, the etching may be done all the way to the micro device substrate. In another case, the etching may be done partially on the planar layers and leaving some on a surface of the micro device substrate. Other layers may be deposited and patterned before forming or after forming the micro devices.

A VIA 408 is formed to provide access to the bottom doped or ohmic layer. The VIA 408 is passivated by a dielectric layer 410. The dielectric can cover the top surface of the micro device. The VIA 408 is fully or partially filled using conductive layer 412. A bump or pad 422 is formed on the top surface coupled to the conductive layer 412. There can be openings in the dielectric (or passivation) if it covers the top surface to provide access to the top surface for the bump 422. The bump 422 is separated from the top side by a dielectric 420 layer (which can be the same as layer 410). Another bump or pad 424 is formed to connect to the top ohmic or doped layer.

Figure 4B:
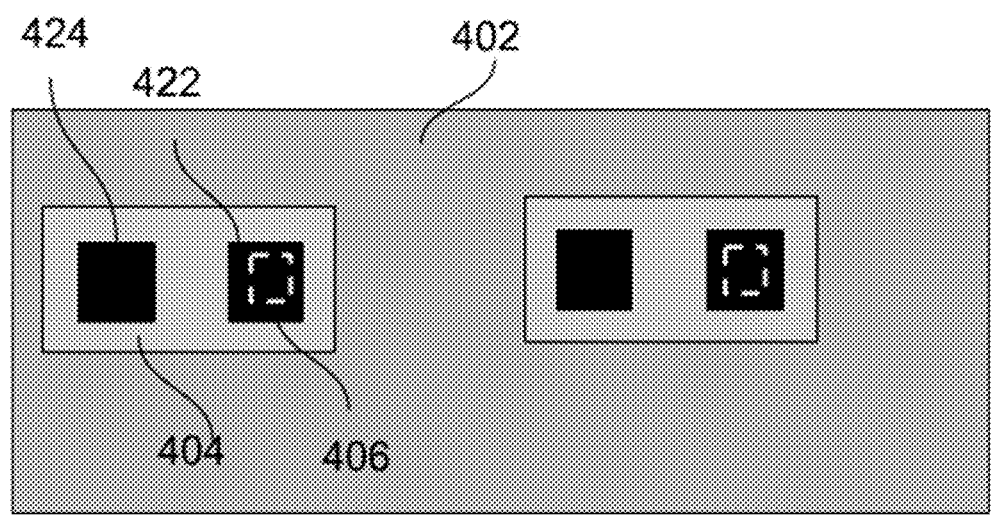
FIG. 4B shows the top of the micro device with bumps.

With reference to FIG. 4B, the bumps 422 and 424 are on the top of the micro device 404. Part of the conductive layer 412 can be connected to the top layer of the micro device 406.

Figure 4C:
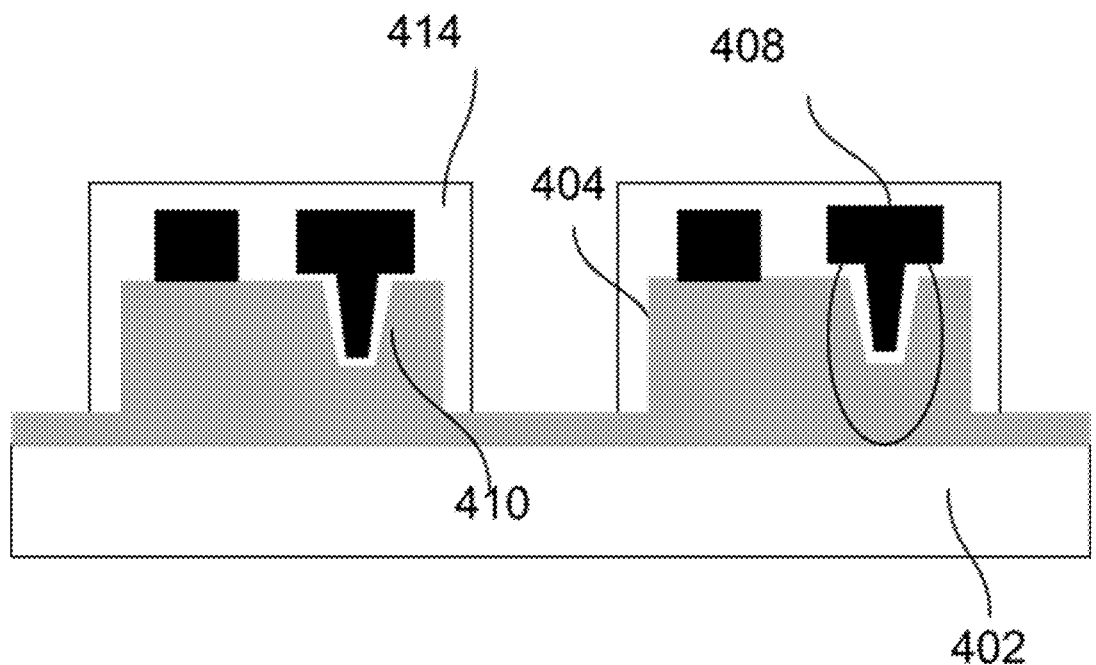
FIG. 4C shows a cross section of the micro device with dielectric covering the top of the micro device with sacrificial layer.
Figure 4D:
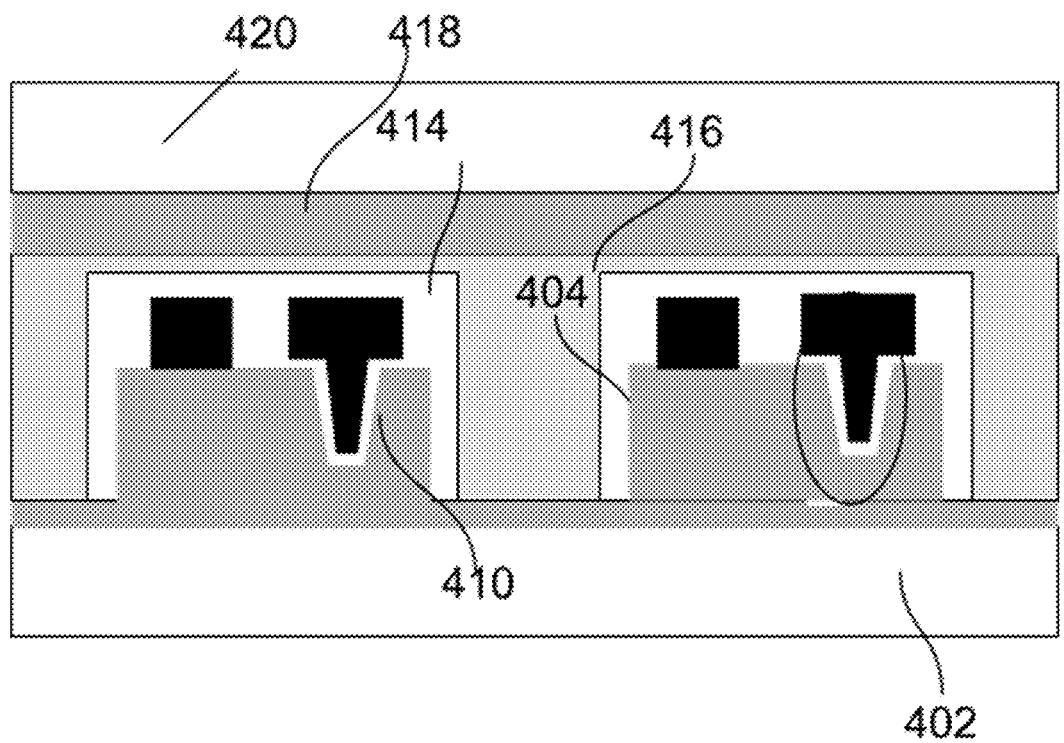
FIG. 4D shows a cross section of the micro device with a planarization layer on the micro device substrate.

As demonstrated in FIG. 4C, a sacrificial layer 414 (or layers) is formed to at least cover the exposed area of the microdevice 404 surfaces. The sacrificial layer 414 can be patterned to have an opening to the device 404 for forming an anchor. In one case, the area on top of the protective layer 412 may have an opening in the sacrificial layers 414. In FIG. 4D, a planarization layer 416 is formed on the micro device substrate 402 to surround the microdevices 404. In one case, there is an opening in the sacrificial layer(s) 414, the opening will get filled with the planarization layer forming an anchor. As demonstrated in FIG. 4D, a bonding layer 418 is used to bond the new structure into a secondary substrate 420. Here, the bonding 418 and planarization layer 416 can be the same. In another case, the planarization layer 416 is developed and cured before bonding with the bonding layer 418.

Figure 4E:
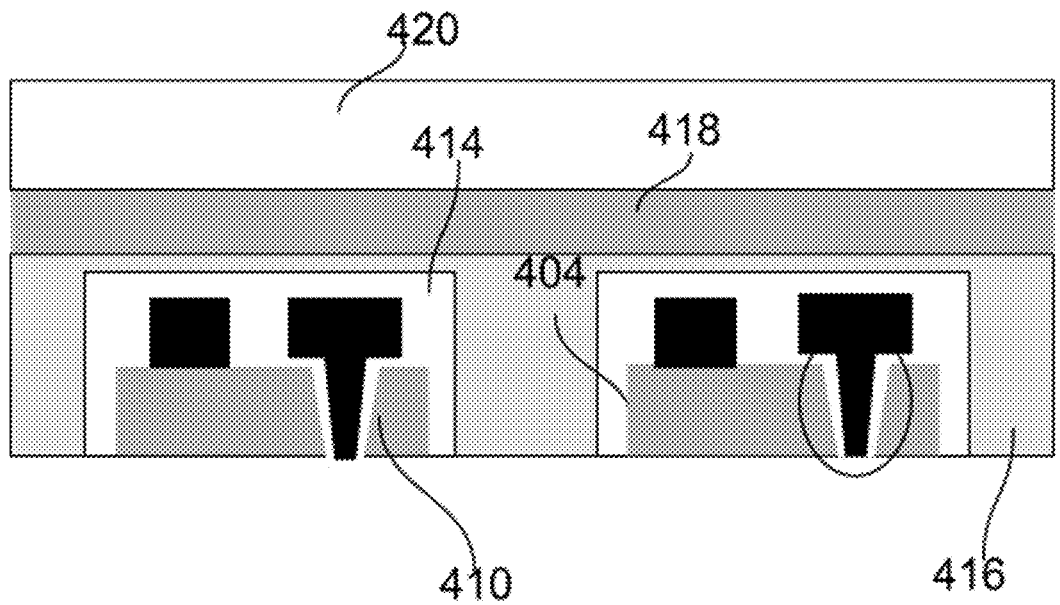
FIG. 4E shows a cross section view of the micro device separated from the first substrate.
Figure 4F:
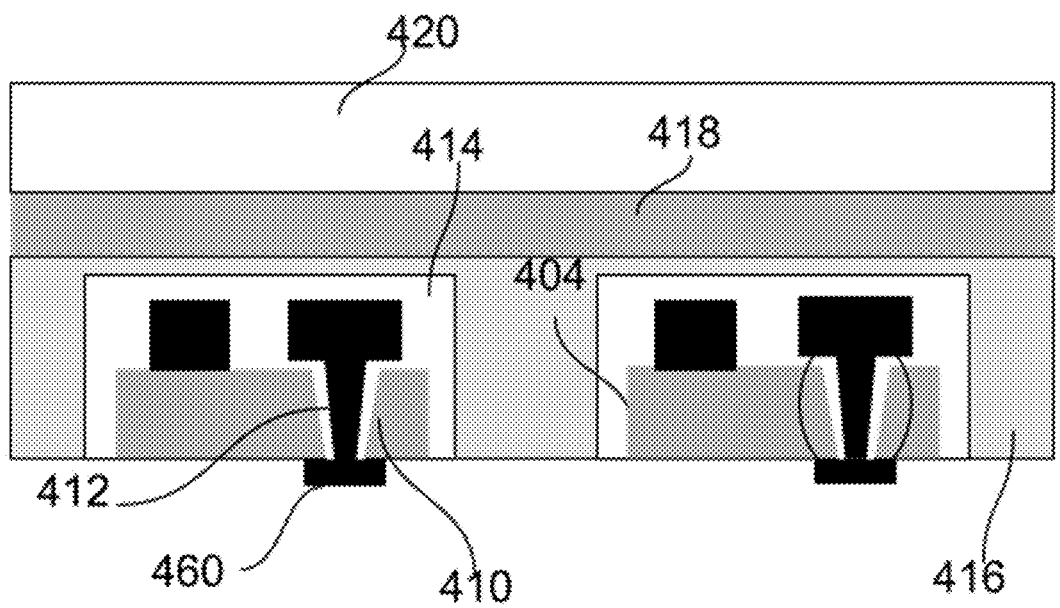
FIG. 4F shows an additional layer connecting the conductive layer to the bottom surface.

With reference to FIG. 4E, the first substrate 402 is separated from the micro device 404. Leaving the structure bonded to the second substrate 420. An etch back or removal of the extra layer can expose the surface of the planarization layer 416 (or sacrificial layer 414). The device can etch back to the open bottom of the VIA 408 and provide access to conductive layer 412. With reference to FIG. 4F, a layer 460 can be formed on the bottom surface to connect the layer 412 to the bottom surface.

Figure 5:
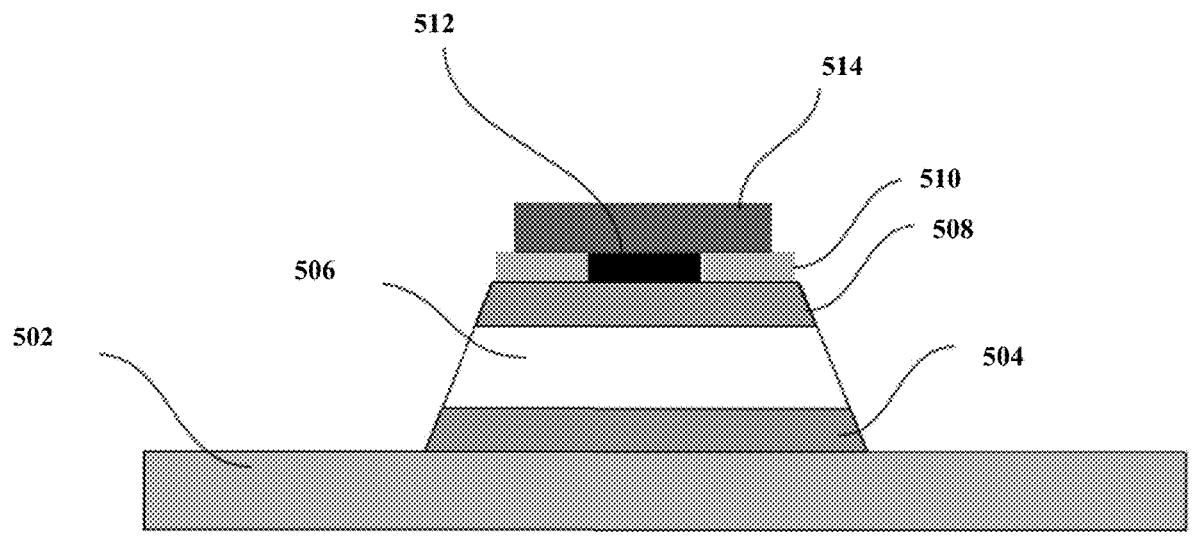
FIG. 5 illustrates a cross-sectional view of a device substrate with a stack of layers deposited thereon in accordance with an embodiment.

FIG. 5 shows an optoelectronic device substrate 502 wherein different conductive layers 504 and active layers 506 are deposited on a top of the device substrate 502 followed by other conductive layers 508. The device comprising a plurality of semiconductor layers disposed on the device substrate 502 forming a top surface and a bottom surface, wherein the plurality of semiconductor layers are isolated into smaller areas forming at least one side surface and at least one conductive pad is formed that is coupled to the optoelectronic device on either the top or the bottom surface. The conductive layers 504 may comprise buffer layers, p type doped layers, n type doped layers, charge blocking layers, and electrode(s). The active layers 506 may comprise a multi quantum well (MQW) layer, and other conductive layers 508. The MQW layer may include a plurality of single quantum layers in a stack. The conductive layers can be transparent or opaque. The examples of a transparent conductive layer are thin Ni/Au or ITO that can be formed on the p-doped semiconductor layer (e.g. GaN or GaAs) for a better lateral current conduction. The conductive layer can have a stack of different layers. For example, the p-type electrode such as Pd/Au, Pt or Ni/Au is then formed on the transparent conductive layer. Here, the ohmic contact 512 is surrounded by a dielectric layer 510. A pad 514 can be deposited over the ohmic contact 512 and can be extended over the dielectric layer. The dielectric layer can avoid unwanted short/coupling between the device and the ohmic contact.

Figure 6A:
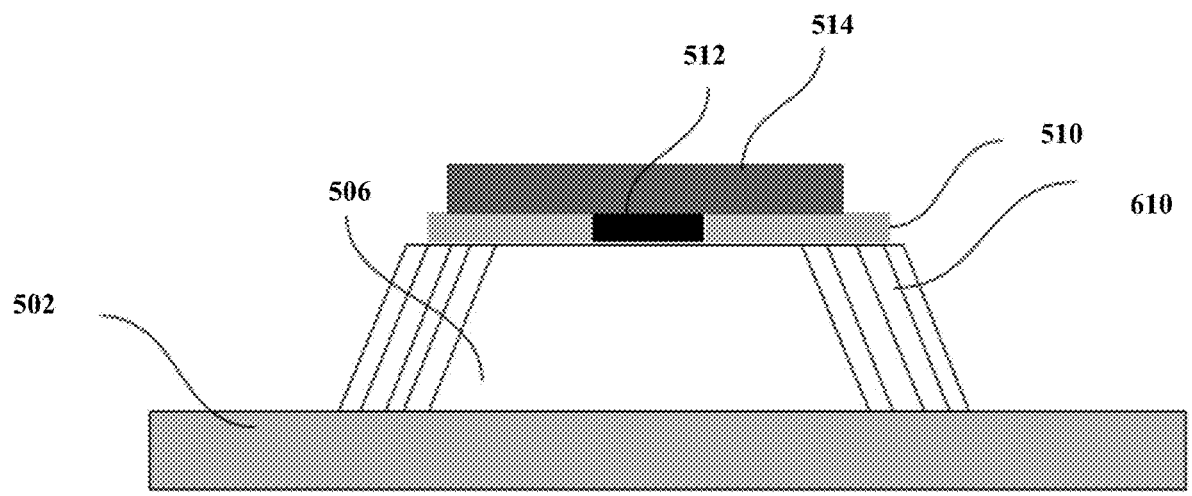
FIG. 6A shows a structure where extension layers are added to the device 110 in accordance with an embodiment.

However, for small devices or devices with multiple pads, the area may not be sufficient to make the pads large. FIG. 6A shows the microdevice 506 formed on the substrate 502 wherein a plurality of extension layers 610 are added to the device 506. Here, the one or more extension layers are formed around the said optoelectronic device 506 at the side surface and at least the one pad extended to the one or more extension layers 610. Some of these extension layers 610 can have other functions such as reflection, color conversion, and etc. The dielectric layer 510 can be extended over the extension layers 610. The pad 514 can extend over the extension layers 610 as well. The extension layers 610 can be also optimized to enhance the light extraction by using different reflection indices. In one case, the extension layers 610 can be formed on a buffer layer deposited on the substrate 502.

In one embodiment, at least one of the one or more extension layers is a polymer and has a width of at least one of the one or more extension layers is between 100 nm to a few micrometers.

Figure 6B:
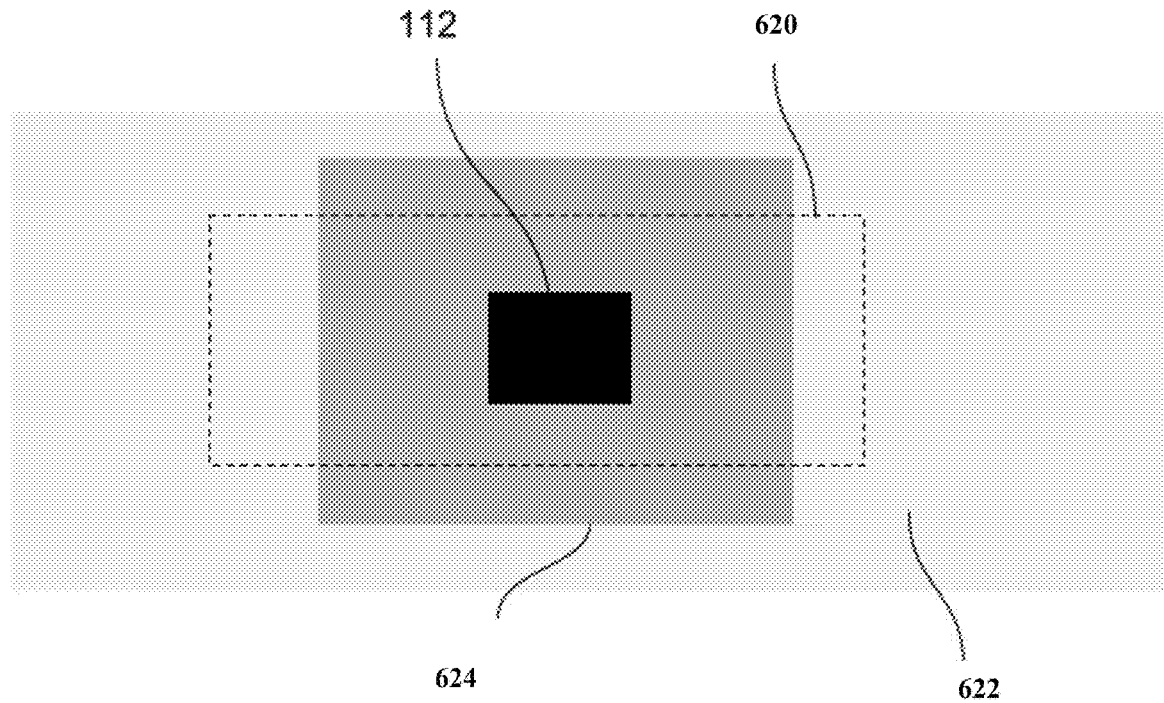
FIG. 6B shows an exemplary top view of the device of the structure in FIG. 2A.

FIG. 6B shows an exemplary top view of the device as shown in FIG. 6A. Here, the extension layers 622 covers at least one side of the micro device 624 and the pad 620 connected to the contact/via 512 extends to at least to a part of the extension layers 622 in one direction.

Figure 7A:
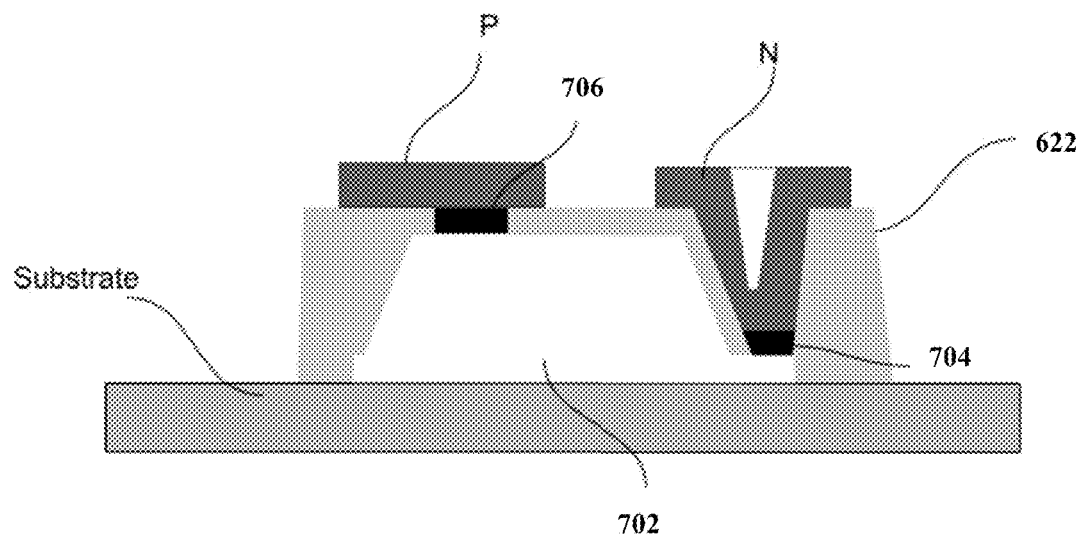
FIG. 7A shows a device where the extension layers are used as planarization layers in accordance with an embodiment.

FIG. 7A shows a device where the extension layers 622 are used as planarization layers as well. Here, the device 702 has more than one contact (706, 704) and there is an opening in the extension layers 622 to provide access to at least one of the contacts (706, 704). The extension layers 622 can include the dielectric layer as well. One of the pads (P, N) at least covers a part of the extension layers 622.

Figure 7B:
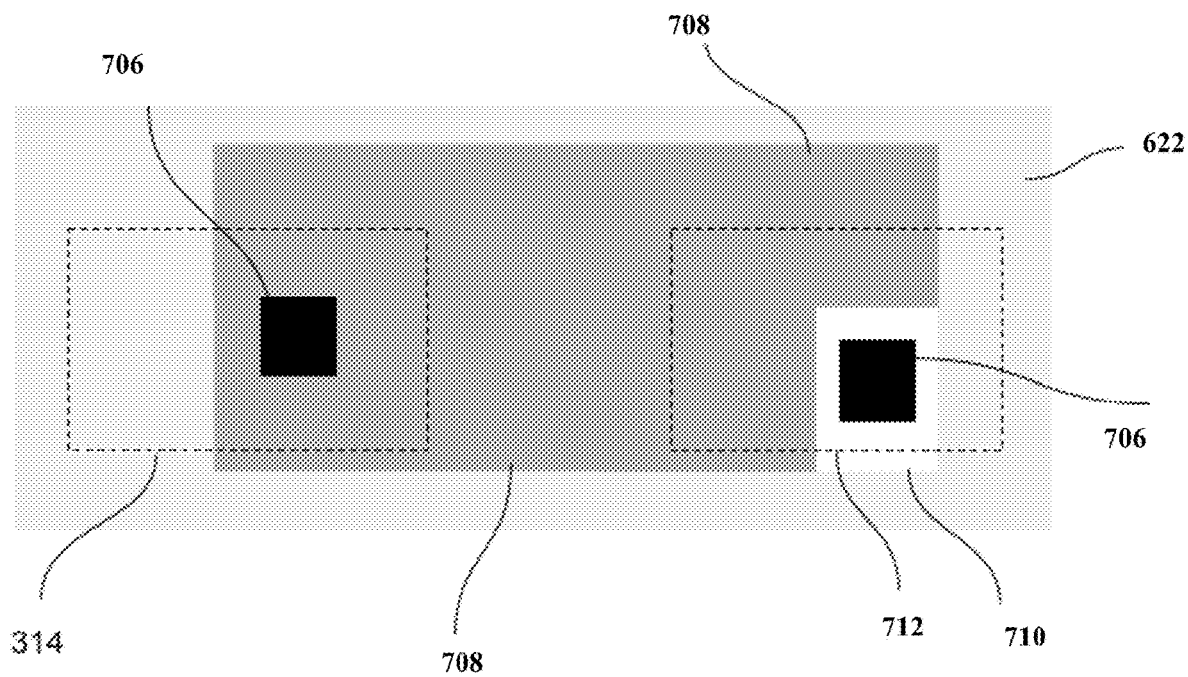
FIG. 7B shows an exemplary top view of the structure in FIG. 3A.

FIG. 7B shows an exemplary top view of the structure in FIG. 7A. Here, the extension layers 622 cover at least one side of a trench 710 to a lower level contact 706. The pad 712 for that connection can extend to at least one area of the extension layer 622. The other contact 308 on the other side of the device 708 is connected to another pad 714 that can be extended to at least another area of the extension layers 622.

Figure 8A:
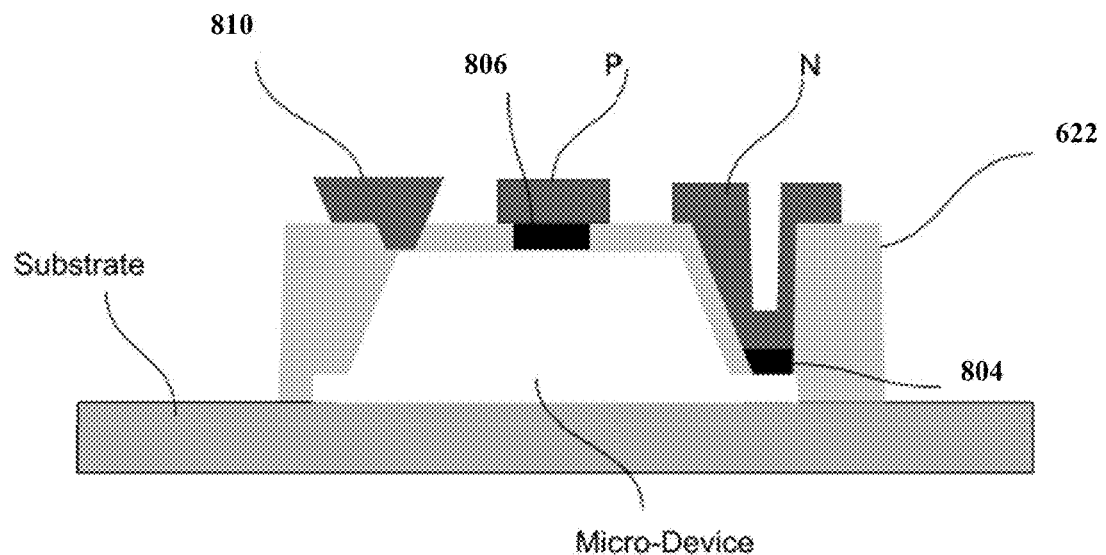
FIG. 8A shows another device embodiment where the extension layers are used as planarization as well in accordance with an embodiment.

FIG. 8A shows another device embodiment where the extension layers 622 are used as planarization layers as well. Here, the device has more than one contact (804, 806) and there is an opening in the extension layers to provide access to at least one of the contacts (804, 806). The extension layers 622 can include the dielectric layer as well. One of the pads (P, N) at least cover part of the extension area. A gate contact 810 can also be provided to the extension layers 622 connected to gate metal.

Figure 8B:
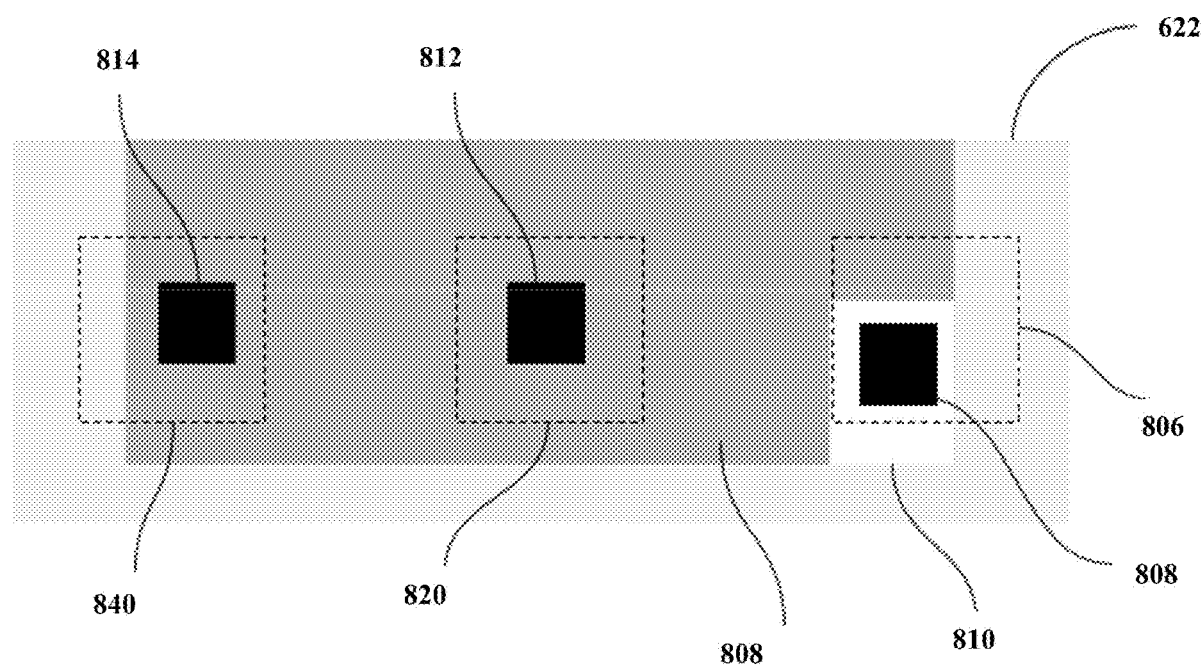
FIG. 8B shows an exemplary top view of the structure in FIG. 4A.

FIG. 8B shows an exemplary top view of the structure in FIG. 8A. Here, the extension layers 622 cover at least one side of the trench 810 to the lower level contact 808. The pad 806 for that connection extends to at least one area of the extension layer 622. Here, other contacts 812 and 814 are connected to the device 308 through other contact pads 820, 840. The other contact 814 on the other side of the device 708 is connected to another pad 840 that is extended to at least another area of the extension layers 622.

Figure 9A:
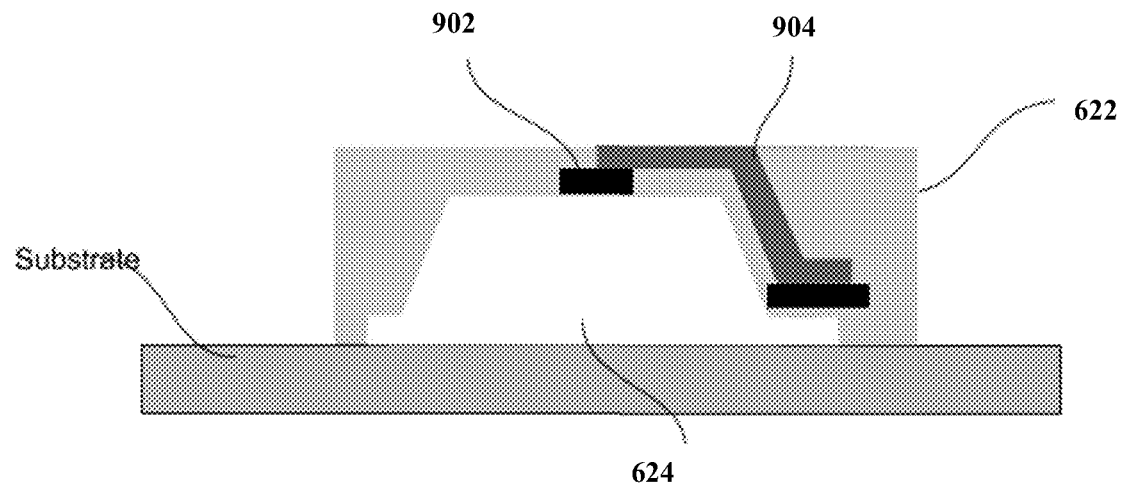
FIG. 9A shows an embodiment where a top contact is extended to the bottom side of the microdevice in accordance with an embodiment.

FIG. 9A shows an embodiment where the top contact 902 is extended to the bottom side of the device 624. The trace 904 is covered by the extension layers 622. After that a via through the extension layers 622 or part of the device area provides access to the device from the other side of the device. The top contact 902 may be connected to the trace through the via.

Figure 9B:
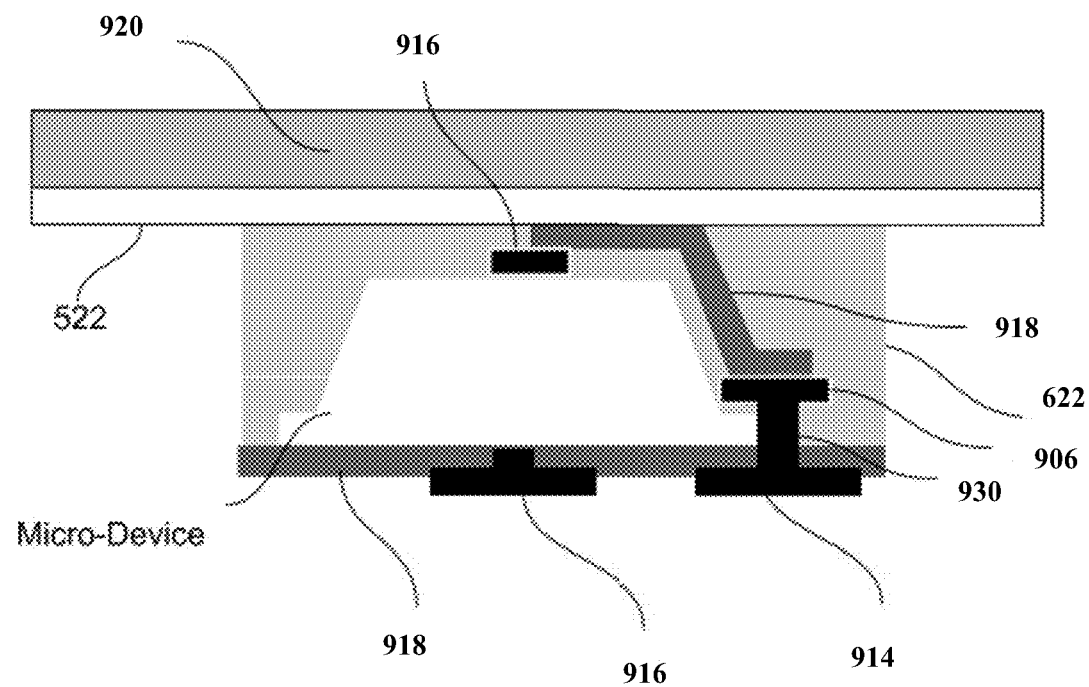
FIG. 9B shows an embodiment where a pad is extended to the extension layers in accordance with an embodiment.

FIG. 9B shows an embodiment wherein the top contact 916 can be extended to the other side of the microdevice through a trace 918. The trace 918 is covered by the extension layers 622. The extension layers 622 can be the planarization layers. A temporary substrate 920 can be bonded on a top surface of the micro device. The extension layers 622 can be formed on a buffer layer 922 deposited on the substrate 920. In one case, there can be an intermediate layer 906 that gets connected to the pad 914 through a via 930. In another case, it can be connected to the pad 914 directly. The pad 914 can be extended to the extension layers 622.

Figure 10:
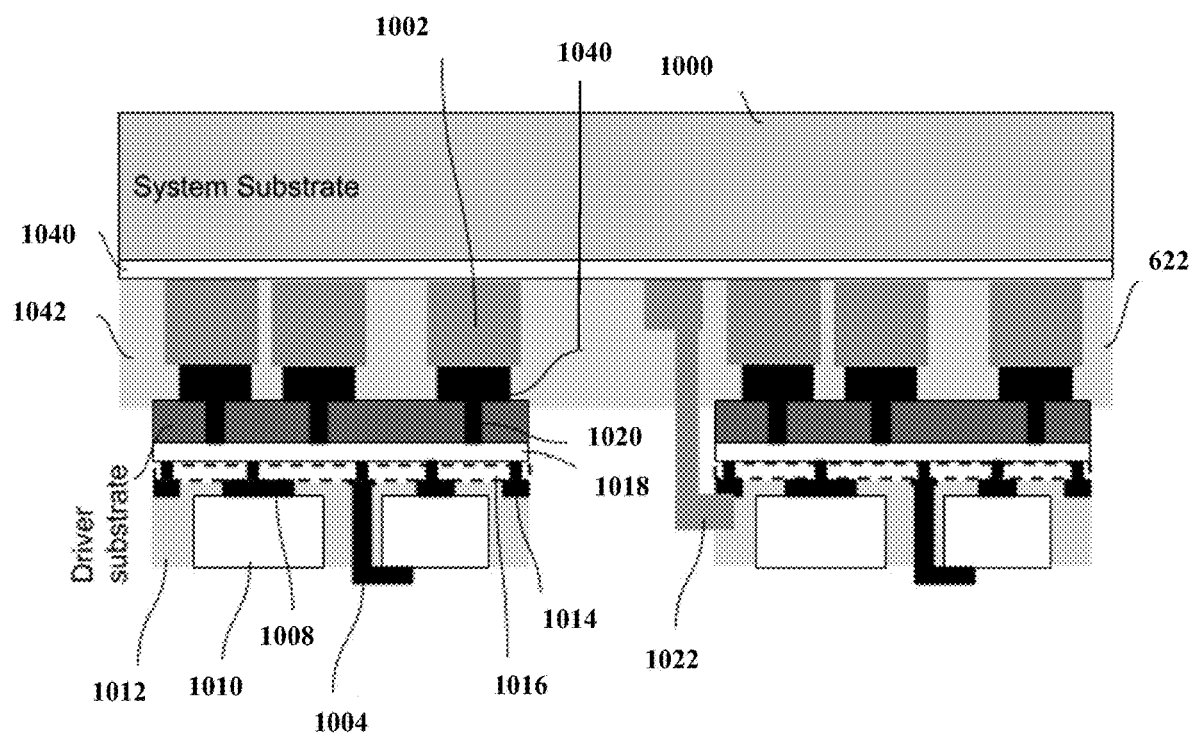
FIG. 10 shows a cross-sectional view of a device substrate in accordance with an embodiment.

FIG. 10 shows an embodiment having plurality of micro devices connected to a driver substrate according to one embodiment of the invention. The driver substrate can include pixel circuits 1018. The micro devices 1010 coupled to the pixel circuits either through bonding pads 1008 or through traces 1004 deposited to cover at least one contact point in the device and one contact point in the driver substrate coupled to the pixel circuit. The driver substrate can have contact pads 1040 on a side different from the side where the microdevices 1010 are located. These contact pads 1040 are either coupled to the pixel circuits 1018 or to the microdevices through a via 1020 in the substrate. There can be a polarization/dielectric layer 1016 between a part of microdevice and part of the driver substrate. There can be further planarization/encapsulation layer 1012 after the microdevices 1010 are integrated in the driver substrate. The driver substrate is then coupled to the system substrate either through the bonding pads 1040 on the driver substrate and the pads 1002 on system substrate 1000 or through traces 1022 deposited to cover at least one contact point in the driver substrate and one contact point in the system substrate 1000. The system substrate 600, can have extra circuitry or contact layers 1042 that enable accessing the driver substrate. The bonding agent 1042 provides mechanical reliability and can also be used as a coupling agent as well. In one case, the bonding agent 1042 can be patterned to be only in selected areas. There can be planarization and bonding agent 640 between system substrate 1000 and driver substrate. Here, a plurality of micro devices 1010 such as red, green and blue can be provided. The plurality of micro devices can be connected together to a driver substrate forming a cell.

According to one embodiment, there is provided an optoelectronic device a plurality of semiconductor layers disposed on a substrate forming a top surface and the bottom surface, wherein the plurality of semiconductor layers having isolated areas forming at least one side surface, at least one conductive pad coupled to the optoelectronic device on at least one of the top or the bottom surface; and one or more extension layers formed around the optoelectronic device at the at least one side surface, wherein the at least the one conductive pad is extended to the one or more extension layers.

According to another embodiment, the one or more extension layers covers at least one side of the optoelectronic device and at least one contact provided through an opening in the one or more extension layers.

According to yet another embodiment, the optoelectronic device further comprising a dielectric layer formed around the at least one contact and extended over the one or more extension layers.

According to some embodiments, at least one pad deposited over the at least one contact layer and extended over the dielectric layer. The one or more extension layers comprises at least one of: another dielectric layer, a reflective layer and a color conversion layer.

According to a further embodiment, the one or more extension layers formed on a buffer layer. The one or more extension layers expand an area of the optoelectronic device.

According to another embodiment, the at least one of the one or more extension layers is a polymer and a width of the at least one of the one or more extension layers is between 100 nm to a few micrometers.

While particular embodiments and applications of the present invention have been illustrated and described, it is to be understood that the invention is not limited to the precise construction and compositions disclosed herein and that various modifications, changes and variations can be apparent from the foregoing descriptions without departing from the spirit and scope of the invention as defined in the appended claims.

The invention claimed is:

1. A micro device structure that comprises of:
   i. a top and bottom doped layer,
   ii. active or functional layers, comprising multi quantum wells, barrier, blocking, and cladding, between the top and bottom layers,
   iii. a VIA from the top doped layer to the bottom doped layer where the VIA is passivated with a dielectric and filled partially or fully by a conductive material that passes a contact from the top doped layer to the bottom doped layer; and
   iv. a top surface of the micro device structure is covered by a dielectric layer.

2. The micro device structure of claim 1, further comprising a first pad or bump formed on the top surface of the micro device structure with openings in the dielectric layer to provide access to a conductive layer.

3. The micro device structure of claim 1, further comprising an ohmic layer partially or fully coupled to the top or the bottom doped layer.

4. The micro device structure of claim 1, further comprising a sacrificial layer formed on the top of the microdevice structure.

5. The micro device structure of claim 4, wherein the sacrificial layer is patterned to have one or more openings to the micro device structure for forming an anchor.

6. The micro device structure of claim 5, wherein an area on top of a protective layer formed on the micro device structure has an opening in the sacrificial layer.

7. The micro device structure of claim 4, wherein the micro device structure is formed on a first micro device substrate and further comprises a planarization layer formed on the sacrificial layer, the planarization layer surrounding the micro device structure.

8. The micro device structure of claim 7, wherein an opening in the sacrificial layer is filled with the planarization layer forming an anchor.

9. The micro device structure of claim 7, wherein a bonding layer for bonding the micro device structure onto a secondary substrate is formed on the planarization layer.

10. The micro device structure of claim 9, the planarization layer is developed and cured before bonding with a bonding layer.

11. The micro device structure of claim 9, the first micro device substrate is separated from the micro device structure leaving the micro device structure bonded to the secondary substrate.

12. The micro device structure of claim 11, wherein an etch back can expose the surface of the planarization layer.

13. The micro device structure of claim 12, wherein a bottom of the VIA is etched back to provide access to the conductive material.

14. The micro device structure of claim 11, wherein a layer formed on the bottom to connect the conductive layer to a bottom surface.

15. The micro device structure of claim 1, wherein a second pad or bump is formed on the top surface of the micro device structure to connect to a top ohmic or the top doped layer.

16. A micro device structure that comprises of:
   a top and bottom doped layer,
   active or functional layers, comprising multi quantum wells, barrier, blocking, and cladding, between the top and bottom layers,
   a VIA from the top doped layer to the bottom doped layer where the VIA is passivated with a dielectric and filled partially or fully by a conductive material that passes a contact from the top doped layer to the bottom doped layer; and
   the VIA is coupled to the top doped layer through extension of a conductive layer on top of the VIA.

17. The micro device structure of claim 16, where there is an ohmic layer partially or fully coupled to the top or bottom doped layer.

18. The micro device structure of claim 16, where a pad or bump is formed coupled with the conductive material while separated from the bottom ohmic or doped layer by a dielectric.

19. The micro device structure of claim 16, where another bump or pad is formed to couple with the bottom ohmic or doped layer.

20. The micro device structure of claim 16, where a protective layer is formed on the top of the microdevice covering the VIA.

* * * * *